US011454871B2

(12) United States Patent
Zhou et al.

(10) Patent No.: US 11,454,871 B2
(45) Date of Patent: Sep. 27, 2022

(54) LASER PROJECTION APPARATUS

(71) Applicant: HISENSE LASER DISPLAY CO., LTD., Shandong (CN)

(72) Inventors: Kan Zhou, Shandong (CN); Zhe Xing, Shandong (CN); Lei Cui, Shandong (CN)

(73) Assignee: HISENSE LASER DISPLAY CO., LTD., Qingdao (CN)

( * ) Notice: Subject to any disclaimer, the term of this patent is extended or adjusted under 35 U.S.C. 154(b) by 290 days.

(21) Appl. No.: 16/800,035

(22) Filed: Feb. 25, 2020

(65) Prior Publication Data

US 2020/0401025 A1 Dec. 24, 2020

Related U.S. Application Data

(63) Continuation of application No. PCT/CN2019/125372, filed on Dec. 13, 2019.

(30) Foreign Application Priority Data

Jun. 20, 2019 (CN) .......................... 201910539491.X
Sep. 19, 2019 (CN) .......................... 201910889319.7
Sep. 19, 2019 (CN) .......................... 201910889320.X

(51) Int. Cl.
*G03B 21/16* (2006.01)
*G03B 21/20* (2006.01)
(Continued)

(52) U.S. Cl.
CPC ......... *G03B 21/16* (2013.01); *G03B 21/2013* (2013.01); *G03B 21/2033* (2013.01);
(Continued)

(58) Field of Classification Search
CPC . G03B 21/16; G03B 21/2013; G03B 21/2033
(Continued)

(56) References Cited

U.S. PATENT DOCUMENTS

2007/0079959 A1 4/2007 Seto et al.
2011/0157560 A1 6/2011 Hsiao
(Continued)

FOREIGN PATENT DOCUMENTS

CN 1779555 A 5/2006
CN 1945423 A 4/2007
(Continued)

OTHER PUBLICATIONS

International Search Report and Written Opinion of the International Searching Authority for corresponding International application No. PCT/CN2019/125372 dated Mar. 13, 2020, 14 pages.
(Continued)

*Primary Examiner* — Jerry L Brooks
(74) *Attorney, Agent, or Firm* — Crowell & Moring LLP

(57) ABSTRACT

Embodiments of the present disclosure describe a laser projection apparatus. The laser projection apparatus includes a laser source system, an optical engine, a lens system that are sequentially connected in a laser beam propagation direction, a plurality of circuit boards, a first heat dissipation system, and a second heat dissipation system. The first heat dissipation system is configured to dissipate heat of a first laser assembly in the laser source system, the optical engine, and the plurality of circuit boards, and to make airflow sequentially flow through the above components to form a first heat dissipation path. The second heat dissipation system is configured to dissipate heat of a second laser assembly in the laser source system, the lens system, and the plurality of circuit boards, and to make airflow sequentially flow through the above components to form a second heat dissipation path.

20 Claims, 18 Drawing Sheets

(51) Int. Cl.
   *H01S 5/024* (2006.01)
   *H05K 7/20* (2006.01)
   *H01S 5/40* (2006.01)
(52) U.S. Cl.
   CPC ...... *H01S 5/02423* (2013.01); *H01S 5/02438* (2013.01); *H01S 5/4093* (2013.01); *H05K 7/20145* (2013.01); *H05K 7/20154* (2013.01); *H05K 7/20172* (2013.01); *H05K 7/20272* (2013.01); *H05K 7/20336* (2013.01)
(58) Field of Classification Search
   USPC .......................................................... 353/54
   See application file for complete search history.

(56) References Cited

U.S. PATENT DOCUMENTS

| | | |
|---|---|---|
| 2013/0250250 A1 | 9/2013 | Lin et al. |
| 2015/0156466 A1 | 6/2015 | Nagatsu et al. |
| 2017/0068150 A1 | 3/2017 | Nishimori et al. |
| 2018/0149952 A1 | 5/2018 | Matsumoto et al. |
| 2018/0364552 A1 | 12/2018 | Chien et al. |
| 2020/0081331 A1 | 3/2020 | Chung et al. |

FOREIGN PATENT DOCUMENTS

| | | |
|---|---|---|
| CN | 101285996 A | 10/2008 |
| CN | 101377613 A | 3/2009 |
| CN | 202837785 U | 3/2013 |
| CN | 103324013 | 9/2013 |
| CN | 104834167 | 8/2015 |
| CN | 106019784 A | 10/2016 |
| CN | 106873288 | 6/2017 |
| CN | 107290915 | 10/2017 |
| CN | 207249336 | 4/2018 |
| CN | 108398804 | 8/2018 |
| CN | 109143742 | 1/2019 |
| CN | 209373333 | 9/2019 |
| JP | 2000091713 | 3/2000 |
| JP | 2008262062 | 10/2008 |
| JP | 2009031557 A | 2/2009 |
| JP | 2009175347 | 8/2009 |
| TW | 201122709 | 7/2011 |

OTHER PUBLICATIONS

Chinese Office Action with English translation regarding 201910889320.x dated Feb. 25, 2022, 12 pages.
Chinese Office Action with English translation regarding 201910888577.3 dated May 6, 2022.
Chinese Office Action with English translation regarding 201910889319.7 dated Apr. 22, 2022.

LASER PROJECTION APPARATUS

CROSS-REFERENCE TO RELATED APPLICATIONS

This disclosure is a continuation application of International Patent Application No. PCT/CN2019/125372 filed on Dec. 13, 2019, which claims priorities to Chinese Patent Application No. 201910539491.X, filed with the Chinese Patent Office on Jun. 20, 2019, Chinese Patent Application No. 201910889319.7, filed with the Chinese Patent Office on Sep. 19, 2019, and Chinese Patent Application 201910889320.X, filed with the Chinese Patent Office on Sep. 19, 2019, all of which are incorporated herein by reference in their entireties.

TECHNICAL FIELD

The present disclosure relates to the field of laser projection technologies, and in particular, to a laser projection apparatus.

BACKGROUND

Laser projection apparatus is a device for realizing projection displays by using a laser source, and is widely applied to the fields of home theaters, business conferences, educational conferences and the like.

SUMMARY

In one aspect, a laser projection apparatus is provided. The laser projection includes a laser source system, an optical engine, and a lens system that are sequentially connected along a laser beam propagation direction, a plurality of circuit boards, a first heat dissipation system and a second heat dissipation system. The first heat dissipation system is configured to dissipate heat of a first laser assembly in the laser source system, the optical engine and the plurality of circuit boards, and to make airflow sequentially flow through the first laser assembly, the optical engine and the plurality of circuit boards to form a first heat dissipation path. The second heat dissipation system is configured to dissipate heat of a second laser assembly in the laser source system, the lens and the plurality of circuit boards, and to make airflow sequentially flow through the second laser assembly, the lens system and the plurality of circuit boards to form a second heat dissipation path.

In another aspect, another laser projection apparatus is provided. The laser projection apparatus includes a laser source system, an optical engine, and a lens system that are sequentially connected along a laser beam propagation direction, a plurality of circuit boards, and a third heat dissipation system. The third heat dissipation system includes a liquid-cooling heat dissipation device, an air-cooling heat dissipation device and a fan assembly. The liquid-cooling heat dissipation device includes a first cooling head, a cooling drain, a plurality of pipes with cooling medium inside. The first cooling head and the cooling drain are connected through at least one of the pipes. The first cooling head is disposed on a first side wall of a housing of the laser source system. The air-cooling heat dissipation device includes at least one first heat dissipation fin, a plurality of heat pipes and a heat conducting plate, and the plurality of heat pipes are fixed on a second side wall of the housing of the laser source system through the heat conducting plate and extend into the at least one first heat dissipation fin. The fan assembly is configured to drive airflow to sequentially flow through the cooling drain, the at least one first heat dissipation fin and the plurality of circuit boards to form a third heat dissipation path.

BRIEF DESCRIPTION OF THE DRAWINGS

In order to describe technical solutions in embodiments of the present disclosure more clearly, the accompanying drawings used in the description of embodiments will be introduced briefly. Obviously, the accompanying drawings to be described below are merely some embodiments of the present disclosure, and a person of ordinary skill in the art may obtain other drawings according to these drawings.

DETAILED DESCRIPTION

The technical solutions in some embodiments of the present disclosure will be described with reference to the accompanying drawings in some embodiments of the present disclosure. Obviously, the described embodiments are merely some but not all of embodiments of the present disclosure. All other embodiments obtained by a person of ordinary skill in the art based on the embodiments of the present disclosure shall be included in the protection scope of the present disclosure.

In the description of the embodiments of the present disclosure, it will be noted that term "installation", "connected", or "attached" is to be understood broadly. For example, it may be a fixed connection, a detachable connection, or an integral connection; and it may be a direct connection, or may be an indirect connection through an intermediate medium, and may be internal communication between two elements. Specific meanings of the above terms in the present disclosure may be understood by those skilled in the art according to specific situations.

In the description and in the claims, terms other than those expressly stated may have nuanced meanings implied in the context. Similarly, phrase "in one embodiment" or "in some embodiments" does not necessarily refer to same embodiment(s), and phrase "in another embodiment" or "in some other embodiments" does not necessarily refer to different embodiment(s). Similarly, phrase "in one example" or "in some examples" does not necessarily refer to same example(s), and phrase "in another example" or "in some other examples" does not necessarily refer to different example(s). For example, a subject that is requested to be protected is intended to include, in whole or in part, exemplary embodiments or a combination of examples.

First, a structure and a working process of a laser projection apparatus according to some embodiments of the present disclosure will be described based on the laser projection apparatus shown in FIG. 1A.

Figure 1A:
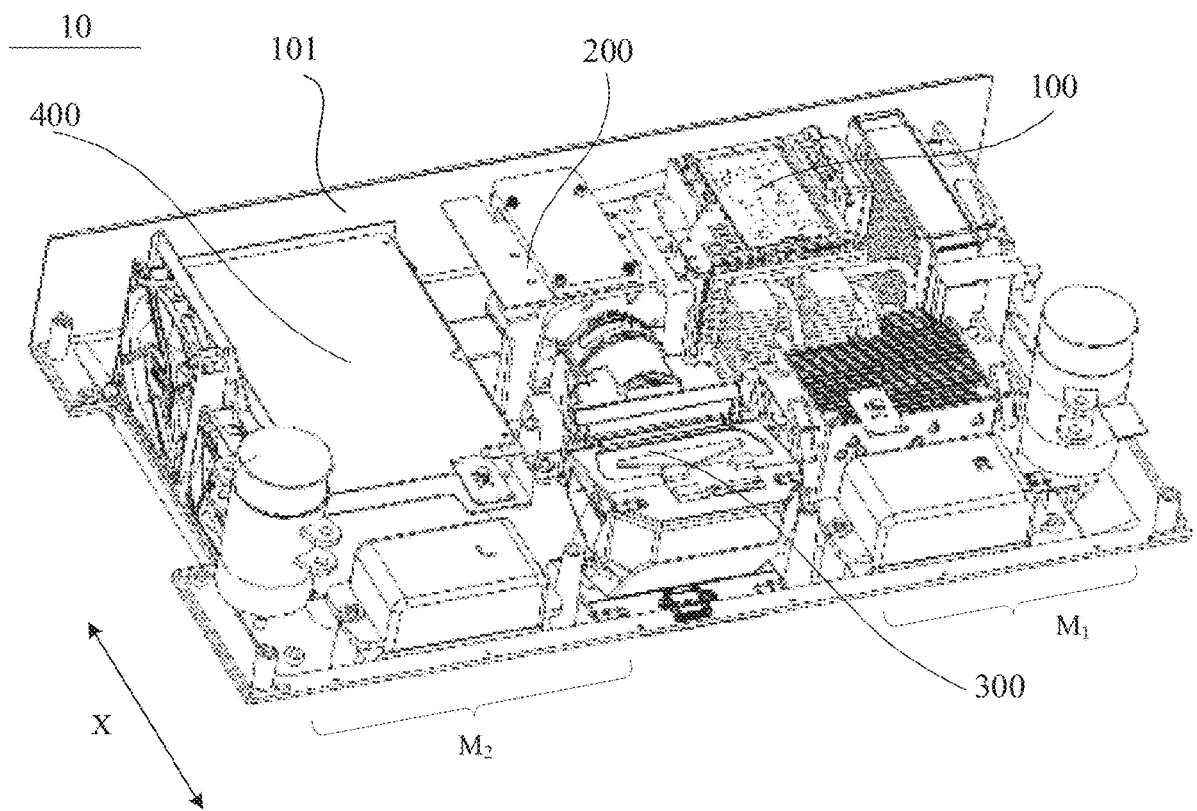
FIG. 1A is a schematic diagram showing a whole structure of a laser projection apparatus, in accordance with some embodiments of the present disclosure.

FIG. 1A is a schematic diagram showing a structure of a laser projection apparatus. As shown in FIG. 1A, the laser projection apparatus 10 includes an apparatus housing 101 and a plurality of optical portions. The plurality of optical portions include a laser source 100, an optical engine 200, and a lens 300 that are all installed in the apparatus housing 101. These optical portions are connected in sequence in a propagation direction of beams, and each optical portion is encapsulated in a corresponding housing to support optical components located in respective housings and meets certain sealing or air-tight requirements. For example, the laser source 100 may be hermetically sealed through a corresponding housing, which may better solve a light attenuation problem of the laser source 100.

The optical engine 200 is connected to the lens 300, and the optical engine 200 and the lens 300 are disposed in a first direction X of the whole apparatus (i.e., the whole laser projection apparatus). For example, the first direction X may be opposite to a viewing direction of a user according to a usage manner, and the first direction X may be a width direction of the apparatus housing. In this way, space in the apparatus housing 101 may be divided into a first region $M_1$ and a second region $M_2$. The first region $M_1$ is at a first side of the lens 300 and the optical engine 200. That is, the first region $M_1$ refers to a space enclosed by the optical engine 200, the lens 300, and a portion of the apparatus housing 101. The second region $M_2$ is at a second side of the lens 300 and the optical engine 200. That is, the second region $M_2$ refers to a space enclosed by the optical engine 200, the lens 300, and another portion of the apparatus housing 101. In some embodiments of the present disclosure, the space enclosed by the optical engine 200, the lens 300, and a portion of the apparatus housing (i.e., the first region $M_1$) is provided with the laser source 100 therein. The laser source 100 is a pure three-color laser source, and is able to emit a red laser beam, a blue laser beam and a green laser beam. The laser source 100, the optical engine 200, and the lens 300 are arranged in an "L" shape. The optical engine 200 and the lens 300 are arranged in a long-side direction of the "L" shape, and the laser source 100 is disposed in a short-side direction of the "L" shape.

Figure 2A:
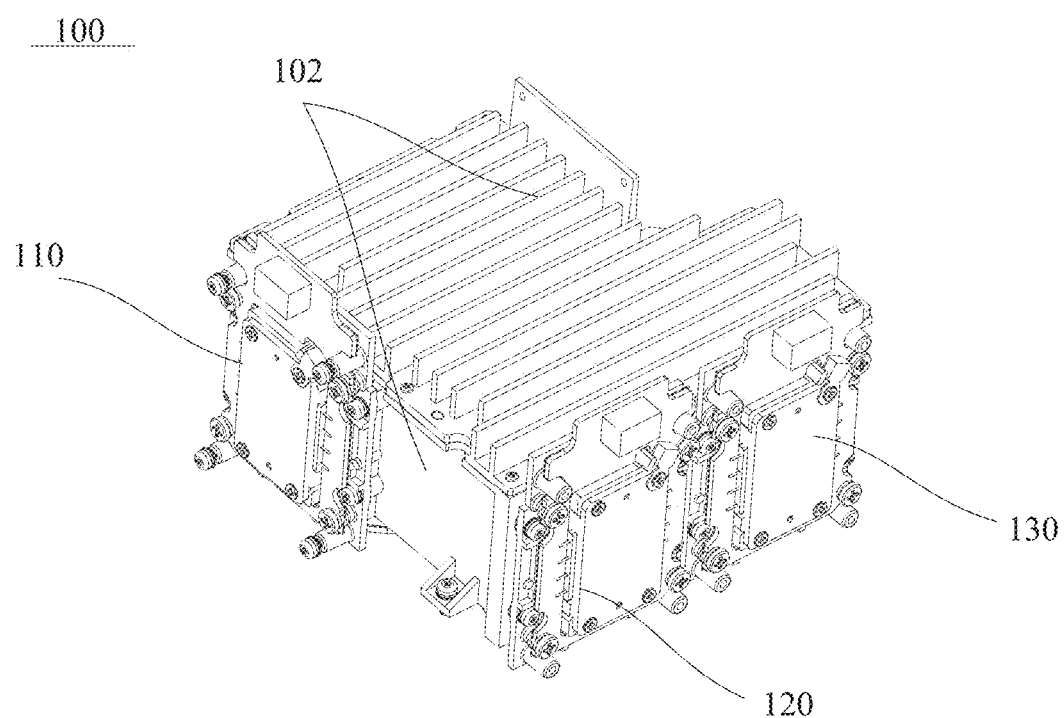
FIG. 2A is a schematic diagram showing a structure of a laser source in the laser projection apparatus shown in FIG. 1A.
Figure 2B:
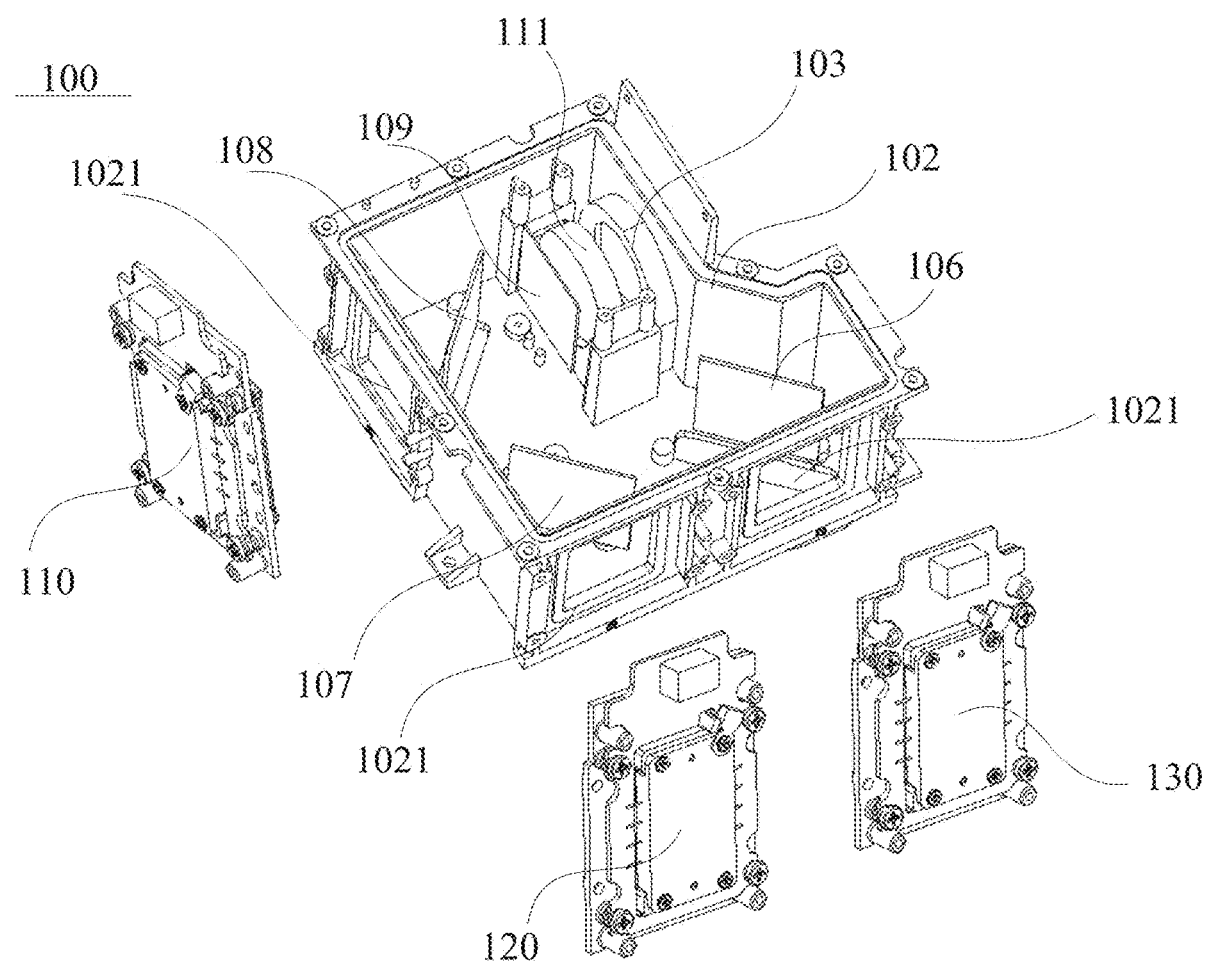
FIG. 2B is a schematic exploded diagram of the structure of FIG. 2A.

Referring to FIGS. 1A and 2B, the laser source 100 has a first laser outlet 103, and the optical engine 200 has a second laser inlet and a third laser outlet. The first laser outlet 103 of laser source 100 is connected to the second laser inlet of the optical engine 200, and the third laser outlet of the optical engine 200 is connected to the lens 300. The laser source is able to provide illumination beams for the optical engine 200. According to a design of an illumination laser path inside the optical engine 200, the second laser inlet and the third laser outlet of the optical engine 200 are usually located on different side walls of the optical engine 200 that are in a perpendicular relationship. The perpendicular relationship herein refers to a perpendicular relationship in spatial positions. Different side walls may be different side walls of an optical engine housing in a cuboid shape, or may be different side walls of an optical engine housing in an irregular three-dimensional shape.

Figure 1B:
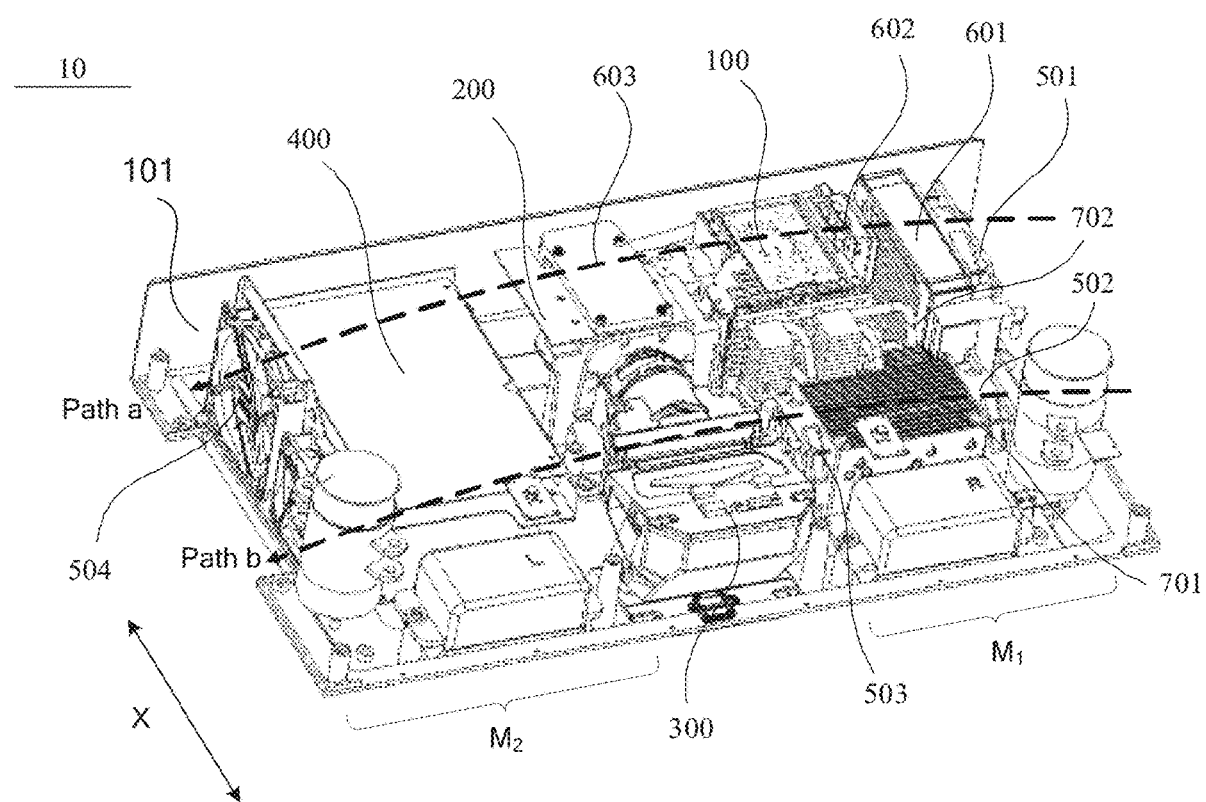
FIG. 1B is a schematic diagram showing a whole heat dissipation path of a laser projection apparatus, in accordance with some embodiments of the present disclosure.
Figure 1C:
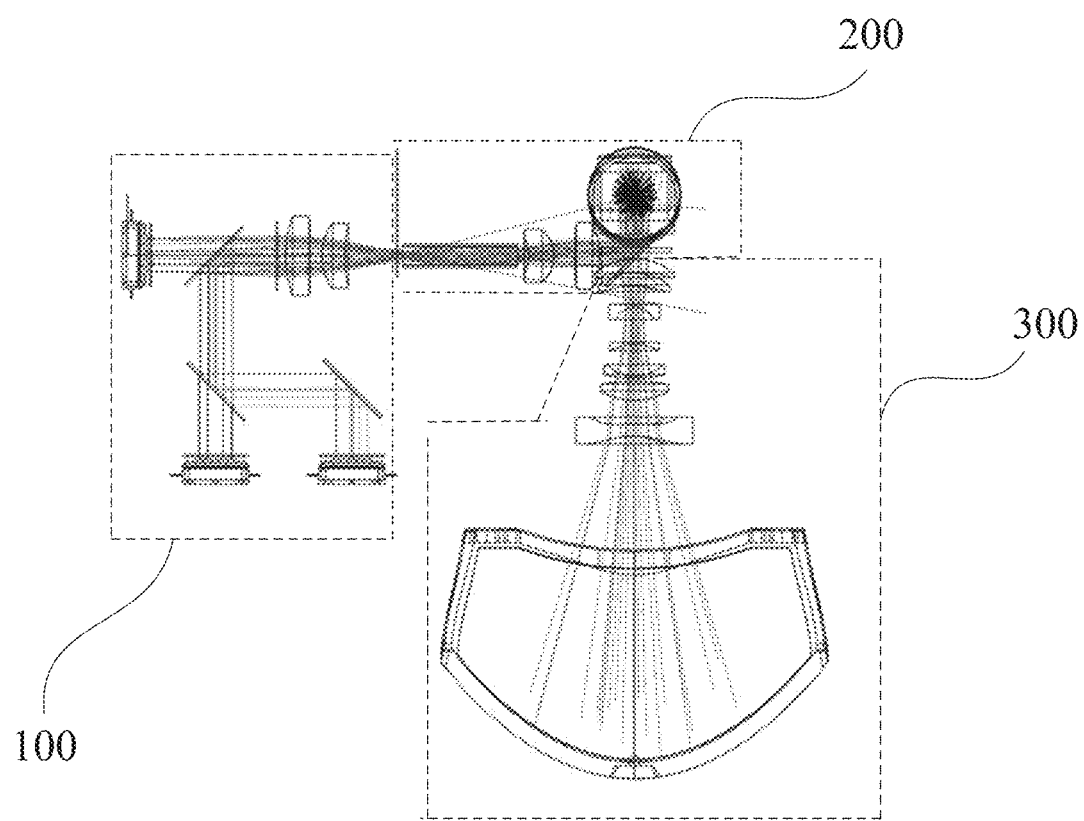
FIG. 1C is a schematic diagram showing a principle of a laser path of a laser projection apparatus, in accordance with some embodiments of the present disclosure.

FIG. 1C is a schematic diagram showing a principle of a laser path of a laser projection apparatus. As shown in FIG. 1C, the laser projection apparatus is divided into three optical portions according to different optical functions, i.e., the laser source 100, the optical engine 200, and the lens 300. The laser source 100 includes a red laser assembly, a blue laser assembly, a green laser assembly and a plurality of optical lenses, and the plurality of optical lenses are able to homogenize and converge the laser beams. Since the laser itself has a strong coherence, in order to solve a speckle problem caused by a laser projection, a speckle reducing component may also be provided in a laser path of the laser source output to the optical engine, such as a rotating diffusion sheet. After the rotating diffusion sheet diffuses the laser beam, a divergence angle of the laser beam may be increased, which is beneficial to solve the speckle problem.

The optical engine includes a laser pipe. Usually, the laser pipe is located at a front end of the optical engine. The laser pipe first receives illumination beams from the laser source, after the laser beams emitted by the laser source 100 enter the optical engine 200. The laser pipe has a laser mixing function and a homogenizing function, and usually an outlet of the laser pipe is approximately rectangular and has a shaping effect on laser spots. The optical engine 200 further includes a plurality of lens groups, such as total internal reflection (TIR) prisms and reverse total internal reflection (RTIR) prisms, which are used to form an illumination laser path, so that the illumination beams may be incident onto a core device of the optical engine, that is, a laser valve. The laser valve is used to modulate the laser beams, and make the modulated laser beams enter the lens groups of the lens 300 for imaging.

Figure 1D:
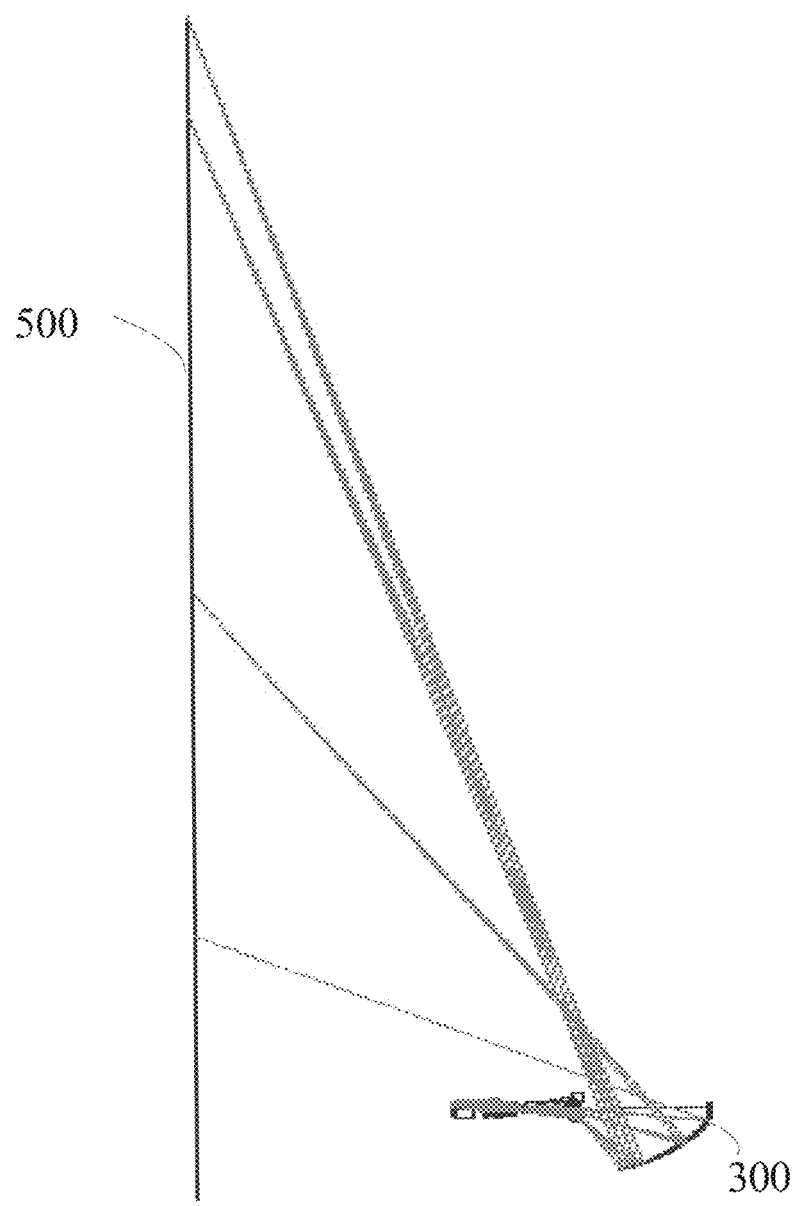
FIG. 1D is a schematic diagram of an ultra-short-focus projection apparatus, in accordance with some embodiments of the present disclosure.

According to different projection architectures, laser valves may have many types, such as a liquid crystal on silicon (LCOS) laser valve, a liquid crystal display (LCD) laser valve or a digital micromirror device (DMD) chip. In some embodiments of the present disclosure, a digital light processing (DLP) projection architecture is applied, and the laser valve is a DMD chip. The laser projection apparatus mentioned in some embodiments of the present disclosure may be an ultra-short-focus projection apparatus. In the ultra-short-focus projection apparatus, the lens 300 is an ultra-short-focus projection lens. The ultra-short-focus projection lens usually includes a refractive lens group and a reflector group, which receive the laser beams reflected by the DMD chip for imaging. As shown in FIG. 1D, the ultra-short-focus projection lens may correct, magnify, and reflect the beams to be incident onto a projection medium (such as a projection screen 500) for imaging. In this way, it is not necessary to space a certain distance from the projection medium for projecting an image with a predetermined size like a telephoto projection apparatus. The ultra-short focus projection apparatus may have a small projection ratio, such as less than or equal to 0.3. In some embodiments of the present disclosure, the projection ratio may be 0.24. Therefore, the projection apparatus in these embodiments of the present disclosure may be closer to the projection medium in a process of projecting an image.

Referring to FIG. 1A, a plurality of circuit boards 400 are disposed in the space enclosed by the optical engine 200, the lens 300, and another portion of the apparatus housing 101 (i.e., the second region $M_2$). The plurality of circuit boards 400 include a power board, a television (TV) board, a control board, and a display board. The plurality of circuit boards 400 may be disposed in a stack. For example, at least part of the plurality of circuit boards 400 may be stacked in a direction perpendicular to a bottom wall of the apparatus housing 101, and/or, at least part of the plurality of circuit boards 400 may be stacked in a direction parallel to the bottom wall of the apparatus housing (e.g., the first direction X).

For example, the plurality of circuit boards 400 are arranged together, and the plurality of circuit boards 400 and the aforementioned optical portions (such as the optical engine and the lens) are arranged in a length direction of the apparatus housing (e.g., a direction being perpendicular to the first direction X and parallel to the bottom wall of apparatus housing). In addition, in the laser projection apparatus 10, a plurality of structures such as a sound (not shown) may be provided.

In the laser projection apparatus provided by the above embodiments, as shown in FIG. 1A, the optical engine 200 and the lens 300 are arranged in the first direction X of the apparatus housing to divide the space in the apparatus housing into two portions. One portion (such as the first region $M_1$) may accommodate the laser source, and the other portion (such as the second region $M_2$) may accommodate the plurality of circuit boards. Such a division may be regarded as a division into an optical region and an electrical region. It will be noted that, a driving circuit is also usually disposed in the optical region. However, the driving circuit in the optical region has a smaller volume and a lower complexity than circuit portions such as the display board, a signal board and the power board. Therefore, it may be considered that, a right portion of FIG. 1A is substantially the optical region, and a left portion of FIG. 1A is substantially the electrical region. Arranging different portions separately not only facilitates an assembly and an adjustment of the laser projection apparatus, but also facilitates to meet respective design requirements of the optical portions and the circuit portions, such as design requirements of heat dissipation, wiring, and electromagnetic testing.

In the laser projection apparatus provided by some embodiments of the present disclosure, the optical engine 200 and the lens 300 are arranged in a same direction, and a portion of the lens groups of the lens 300 extend into the inside of the optical engine 200, which is beneficial to reduce a volume of an assembly composed of the optical engine 200 and the lens 300. According to laser exit characteristics of the reflective laser valve, although the reflective laser valve is subject to architectures of different illumination laser paths, the laser beams emitted by the laser source 100 may finally enter the lens 300 after deflections for a plurality of times. Comparing a direction of a laser beam emitted from the first laser outlet of the laser source 100 with a direction of a laser beam incident onto a laser-entry surface of the lens 300, it may be considered that a direction of an optical axis of a laser beam emitted by the laser source 100 is perpendicular to a direction of an optical axis of a laser beam entering the lens 300 in space. The laser source 100, the optical engine 200, and the lens 300 form an L-shape after being assembled, which provides a structural basis for a deflection of the optical axes of the laser beams, and reduces a design difficulty of laser paths in which the optical engine 200 enters the lens 300. In addition, an overall layout of the laser projection apparatus is very compact, and an architecture of the laser paths is also very simple.

In the related art, laser sources include a monochromatic laser source and a bichromatic laser source. In the monochromatic laser source, a blue laser assembly excites fluorescent powder to generate primary light of other two colors (such as red fluorescence and green fluorescence), or to generate more than two colors of fluorescence. The bichromatic laser source includes a blue laser assembly and a red laser assembly, and the blue laser assembly excites fluorescent powder to generate green fluorescence (or green fluorescence and other colors of fluorescence). Thus, a fluorescent wheel is required in the laser source component, and an excitation laser path also needs to be shaped. The fluorescent wheel also needs a corresponding driving motor and a heat dissipation component to ensure a normal operation. So that a non-three-color laser source has a complicated and long laser path, and a large volume. As a result, a volume of the whole laser source is equivalent to a sum of a volume of the optical engine and a volume of the lens, which forms a bottleneck restricting a volume structure design of the apparatus.

In some embodiments of the present disclosure, a three-color laser source is used. The three-color laser source respectively generates three primary colors of laser by three laser assemblies and does not use a wavelength conversion component such as a fluorescent wheel to generate fluorescence. In this way, a corresponding drive and a heat dissipation component are omitted, which simplifies the laser path, so that a structural volume of the laser source is greatly reduced, and the laser source, the optical engine and the lens may be arranged in the L-shape, and the laser path structure is more regular and compact. Moreover, a reduction in a volume of the laser source also provides space for a setting of the heat dissipation system.

In some embodiments of the present disclosure, the laser source 100 is used to provide illumination for the optical engine 200. For example, the laser source 100 provides the illumination beams for the optical engine 200 by sequentially outputting illumination beams of three primary colors.

It will be noted that, the laser source 100 may also non-sequentially output the illumination beams, that is, there is a period in which the illumination beams of different primary colors are output together. For example, there is a period in which a red illumination beam and a green illumination beam are output together, thereby increasing a proportion of a yellow illumination beam in a beam cycle.

In this way, it is beneficial to improve a luminance of an image. For another example, a red illumination beam, a green illumination beam, and a blue illumination beam are simultaneously output in a certain period. The illumination beams of the three colors are superimposed to form a white illumination beam, which may increase a luminance of a white field. Therefore, in a case where the optical engine 200 includes a three-piece LCD laser valve, in order to correspond to the three-piece LCD laser valve, laser beams of three primary colors from the laser source 100 may be simultaneously output to form a mixed white laser beam.

In some embodiments of the present disclosure, although the laser source 100 sequentially outputs the laser beams of the three primary colors, according to a trichromatic mixing principle, human eyes are unable to distinguish different colors of the laser beams at a certain time, and what is perceived by the human eyes is still the mixed white laser beam. Therefore, a laser beam output from the laser source 100 is usually referred to as the mixed white laser beam.

In the laser projection apparatus, the laser source is a main heat source. Heat will be generated after high-density energy beams of the laser assemblies are irradiated onto surfaces of the optical lenses. The DMD chip has an area of a few tenths of an inch, but needs to withstand energy of the laser beams required for a whole projected image, and heat generated by the DMD chip is also very high. Moreover, the laser assembly has a set operating temperature to form a stable laser output, thereby taking both of a service life and performances into account. In addition, the laser projection apparatus includes a plurality of precise optical lenses, especially a plurality of lenses in the ultra-short-focus lens. If a temperature inside the whole apparatus is too high and heat accumulates, a "temperature drift" phenomenon of the lenses in the lens will occur, and an imaging quality will be seriously reduced. In addition, electronic devices on the circuit board will generate a certain amount of heat after being driven by the electrical signal, and each electronic device also has a set operating temperature. Therefore, a good heat dissipation and a temperature control are very important guarantees for a normal operation of the laser projection apparatus.

In some embodiments, the laser projection apparatus also includes heat dissipation systems besides the laser source, the optical engine, the lens and the plurality of circuit boards. The heat dissipation systems are used for dissipating heat of the plurality of optical portions and the plurality of circuit boards to ensure a normal operation of the apparatus. In the laser projection apparatus in these embodiments of the present disclosure, heat dissipation systems include a first heat dissipation system and a second heat dissipation system. The first heat dissipation system is configured to dissipate heat of the first laser assembly in the laser source, the optical engine and the plurality of circuit boards, and make airflow sequentially flow through the first laser assembly, the optical engine and the plurality of circuit boards to form a first heat dissipation path. The second heat dissipation system is configured to dissipate heat of the second laser assembly in the laser source, the lens and the plurality of circuit boards, and make airflow sequentially flow through the second laser assembly, the optical engine and the plurality of circuit boards to form a second heat dissipation path.

Referring to FIG. 1B, FIG. 1B illustrates heat dissipation paths based on the structure of the laser projection apparatus shown in FIG. 1A.

According to an airflow direction, the laser projection apparatus in some embodiments of the present disclosure has two main heat dissipation paths, that is, the first heat dissipation path a and the second heat dissipation path b. For example, the first heat dissipation path a primarily dissipates heat of the first laser assembly (e.g., a red laser assembly) of the laser source 100, the optical engine 200, and a portion of the plurality of circuit boards 400 located downstream of the optical engine 200 along the first heat dissipation path a. The second heat dissipation path b primarily dissipates heat of the second laser assembly (e.g., a blue laser assembly and a green laser assembly) of the laser source 100, the lens 300, and a portion of the plurality of circuit boards 400 located downstream of the lens 300 along the second heat dissipation path b.

The first heat dissipation path a and the second heat dissipation path b are two paths that are substantially parallel to each other. In the laser projection apparatus, the laser source 100 is disposed at a side of the laser projection apparatus, the optical engine 200 and the lens 300 are disposed in a middle of the laser projection apparatus, and the plurality of circuit boards 400 are disposed at another side of the laser projection apparatus. As shown in FIG. 1B, the airflow flows from left to right whether along the first heat dissipation path a or the second heat dissipation path b. As a whole, the airflow is blown from the laser source 100 toward the optical engine 200 or the lens 300, and then toward the plurality of circuit boards 400. Therefore, not only can the laser source 100 be cooled effectively and rapidly, so that a temperature control requirement of a low temperature of the laser source 100 is met, but also a heat dissipation of portions with lower temperature control requirements is considered. That is, airflow carrying heat of laser heat source may be continuously blown toward the optical engine or the lens. Since a temperature of the airflow continuously blown toward the optical engine or the lens is lower than a temperature of the optical engine or the lens, a temperature exchange may still be carried out, that is, heat of the optical engine or the lens may be dissipated. Finally, the airflow flows to a circuit board region (i.e., a second region $M_1$) of the apparatus housing proximate to the air outlet, takes away heat in the circuit board region, and is discharged from the air outlet of the apparatus housing 101.

As shown in FIG. 1B, the first heat dissipation system includes a first fan 501 and a fourth fan 504. In the first heat dissipation path a, the first fan 501 is provided at an air inlet of the apparatus housing, and the fourth fan 504 is provided at an outlet of the apparatus housing. The first fan 501 and the fourth fan 504 guide the airflow of the first heat dissipation path a, so that from upstream to downstream, the airflow may sequentially flow through the first laser assembly (such as the red laser assembly) of the laser source 100, the optical engine 200, and a portion of the plurality of circuit boards 400 located downstream of the optical engine 200 along the first heat dissipation path a, and may be finally discharged out of the apparatus housing.

As shown in FIG. 1B, the second heat dissipation system includes a second fan 502 and a third fan 503. The second fan 502 is provided in the second heat dissipation path b, and the second fan 502 may be disposed proximate to the air inlet of the apparatus housing or may be directly disposed at the air inlet of the apparatus housing. In addition, in order to increase a wind pressure, the third fan 503 may be disposed in the middle of the second heat dissipation path b. The third fan 503 may guide the airflow of the second heat dissipation path b together with the second fan 502, so that from upstream to downstream, the airflow may sequentially flow through the second laser assembly (such as the blue laser assembly and the green laser assembly) of the laser source 100, the lens 300, and a portion of the plurality of circuit boards 400 located downstream of the lens 300 along the second heat dissipation path b, and may be finally discharged out of the apparatus housing. For example, the third fan 503 is disposed at a side of the lens 300 away from the plurality of circuit boards, so that the flow velocity of the airflow toward the lens may be enhanced.

In the above-mentioned laser projection apparatus, there are a plurality of heat source components in the apparatus housing, and requirements for heat dissipation of different heat source components are also different. For example, among heat source components such as the laser source, the DMD chip, the lens, the plurality of circuit boards and the like, the laser source is a main heat source of the whole laser projection apparatus, and has the highest temperature control requirement. In some embodiments of the present disclosure, the laser source 100 is the pure three-color laser source, and the laser assemblies of different colors included in the laser source 100 have different operating temperature requirements. An operating temperature of the red laser assembly is less than or equal to 50° C., an operating temperature of the blue laser assembly is less than or equal to 70° C., and an operating temperature of the green laser assembly is less than or equal to 65° C. An operating temperature of the laser valve (such as a DMD chip) in the optical engine is usually controlled at approximately 70° C., and an operating temperature of the lens is usually controlled below 85° C. Since operating temperatures of different electronic devices are different, an operating temperature of the circuit board is usually between 80° C. and 120° C. It will be seen that, temperature tolerance values of the optical portions are different from temperature tolerance values of the circuit portions, and operating temperature tolerance values of the optical portions are usually lower than those of the circuit portions, Therefore, the airflow is blown from the optical portions toward the circuit portions, and a purpose of heat dissipation of the two portions may be achieved, and respective normal operations may be maintained.

In the laser projection apparatus 10 shown in FIG. 1B, the first heat dissipation system includes a liquid-cooling heat dissipation device for dissipating heat of the red laser assembly. In some embodiments, the liquid-cooling heat dissipation device includes a cooling drain 601, a first cooling head 602, pipe(s) connected the cooling drain 601 and the first cooling head 602, and cooling medium(s) located in the pipe(s). The first cooling head 602 is disposed on a first side wall of a housing of the laser source 100, and a red laser assembly is installed on the first side wall of the housing of the laser source 100. For example, there is a gap between the first cooling head 602 and the red laser assembly, or the first cooling head 602 is in direct contact with the red laser assembly, or the first cooling head 602 is in contact with the red laser assembly through a heat conducting plate. A first fan 501 and a cooling drain 601 disposed in a stack are disposed between a side wall of the housing of the laser source 100 where the red laser assembly is installed and the apparatus housing, or are disposed upstream of the red laser assembly. The first fan 501 drives the airflow to flow through the cooling drain 601 to cool the cooling medium in the cooling drain 601, so that heat of the red laser assembly may be dissipated by the cooling medium circulated between the cooling drain 601 and the first cooling head 602.

The second heat dissipation system includes an air-cooling heat dissipation device for dissipating heat of the blue laser assembly and the green laser assembly. In some embodiments, the air-cooling heat dissipation device includes a first heat dissipation fin 701 and a heat pipe 702. A second side wall of the housing of the laser source 100 is provided with a second laser assembly. The second laser assembly includes two sets of laser assemblies, i.e., a blue laser assembly and a green laser assembly. The two sets of laser assemblies conduct heat through the heat pipe 702 to the first heat dissipation fin 701. A side of the first heat dissipation fin 701 is provided with the second fan 502. The second fan 502 is located at the air inlet of the apparatus housing. Another side of the first heat dissipation fin 701 is provided with the third fan 503. The third fan 503 and the second fan 502 jointly drive the airflow to sequentially flow through the first heat dissipation fin 701, the lens 300, and a portion of the plurality of circuit boards 400 located downstream of the lens 300 along the second heat dissipation path b.

For example, the heat pipe 702 is a phase change heat pipe. For example, the heat pipe 702 is a closed pipe with a phase change material inside.

In some embodiments, the first fan 501 and the second fan 502 are both located at the air inlet of the apparatus housing, and are arranged side by side in the first direction X of the apparatus housing, so that the first fan 501 and the second fan 502 are respectively located in different heat dissipation paths in the heat dissipation system of the laser projection apparatus. That is, the first fan 501 is located in the first heat dissipation path a, and the second fan 502 is located in the second heat dissipation path b The laser source 100 is used as the main heat source of the laser projection apparatus. The three-color laser source will be described below in combination with drawings, in which FIG. 2A is a schematic diagram showing a structure of the laser source 100 in FIG. 1A.

As shown in FIG. 2A, the laser source 100 includes a laser source housing 102 (i.e., the housing of the laser source 100), and a red laser assembly 110, a blue laser assembly 120, and a green laser assembly 130 that are installed on different side walls of the laser source housing 102. The red laser assembly 110 is able to emit a red laser beam, the blue laser assembly 120 is able to emit a blue laser beam, and the green laser assembly 130 is able to emit a green laser beam. The blue laser assembly 120 and the green laser assembly 130 are installed side by side on a same side wall (i.e., a second side wall), and are both perpendicular to the red laser assembly 110 in space. That is, a side wall (i.e., the second side wall) of the laser source housing 102 where the blue laser assembly 120 and the green laser assembly 130 are located is perpendicular to a side wall (i.e., a first side wall) of the laser source housing 102 where the red laser assembly 110 is located, and the two side walls are both perpendicular to a bottom wall of the laser source housing 102 or the bottom wall of the apparatus housing 101. It should be noted that, installation positions of the blue laser assembly and the green laser assembly are not limited to this. In some other examples, a position of the blue laser assembly and a position of the green laser assembly are interchangeable.

Figure 5A:
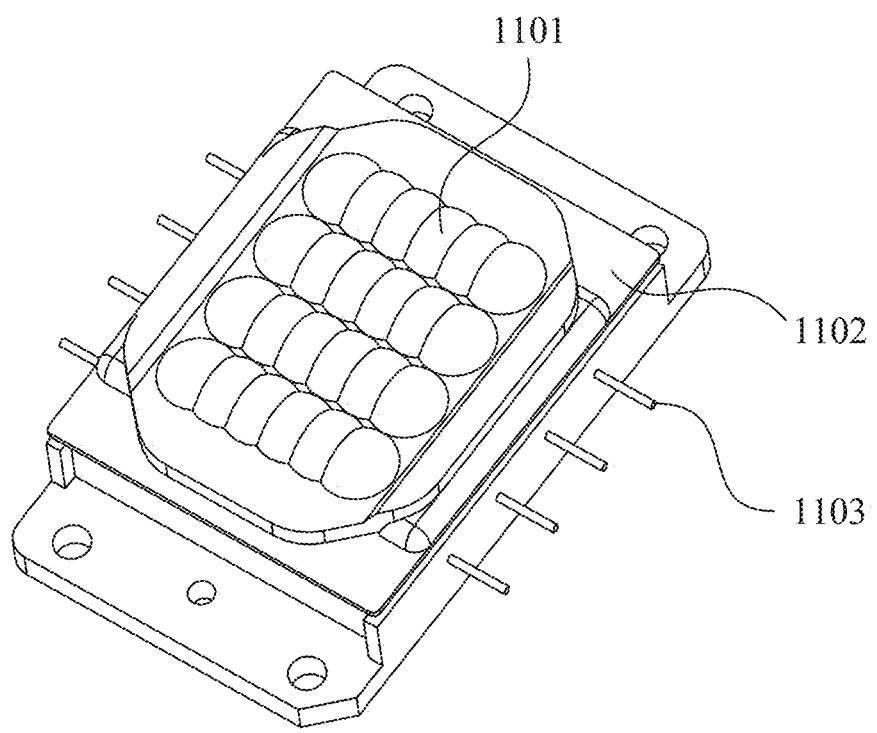
FIG. 5A is a schematic diagram showing a structure of an MCL laser, in accordance with some embodiments of the present disclosure.

FIG. 2B is a schematic exploded diagram of the structure of the laser source shown in FIG. 2A. FIG. 5C is a schematic diagram showing a principle of a laser path of a laser source 100. As shown in FIGS. 2B and 5C, the blue laser assembly 120 and the green laser assembly 130 are arranged side by side. The blue laser assembly 120 is disposed proximate to the red laser assembly 110 and the green laser assembly 130 is disposed away from the red laser assembly 110. That is, the blue laser assembly 120 is more proximate to the red laser assembly 110 than the green laser assembly 130. A laser-emitting surface of the red laser assembly 110 faces the first laser outlet 103 of the laser source 100. That is, a red laser beam emitted from the red laser assembly 110 may be directly output from the first laser outlet 103 of the laser source 100 to the optical engine, without a deflection of a laser path.

A green laser beam emitted from the green laser assembly 130 is emitted from the first laser outlet 103 after being reflected three times, and a blue laser beam emitted from the blue laser assembly 120 is emitted from the first laser outlet 103 after a single transmission and a single reflection. It will be seen that, in the above schematic diagram showing the principle of the laser path, the red laser beam has the shortest laser path, the green laser beam has the longest laser path, and the green laser beam is reflected the most.

Referring to FIG. 2A, the above laser assembly of any of the three colors outputs a rectangular laser spot. After the laser assemblies of respective colors are installed on the side walls of the laser source housing, a long side of a rectangular laser spot correspondingly output is perpendicular to the bottom wall of the laser source housing. In this way, the laser spots output by the laser assemblies of the three colors will not form a cross-shaped laser spot in a case of a combination of the laser spots, which is beneficial to a reduction of a size of a combined laser spot and a high homogeneity. It will be noted here that, in a case where the laser assemblies of the three colors sequentially output the red laser beam, the green laser beam, and the blue laser beam, the "combination of the laser spots" and the "combined laser spot" herein refer to a spot of the mixed white laser beam perceived by the human eyes.

Referring to FIGS. 2A and 2B, the laser source housing 102 includes a top cover and the bottom wall, and a plurality of side walls located between the top cover and the bottom wall. The first laser outlet 103 is located on one of the side walls. The laser source 100 further includes a plurality of optical lenses, and the plurality of optical lenses are disposed on the bottom wall of the laser source housing 102. The top cover of the laser source housing 102 is fin-shaped, which may increase a heat dissipation area. The side walls of the laser source housing 102 are provided with a plurality of openings 1021 to facilitate to install the above plurality of laser assemblies, so that a laser beam emitted from a laser assembly of any of the three colors may enter the laser source housing 102 through a corresponding opening, and then form a laser transmission path through the plurality of optical lenses.

The laser assembly of any of the three colors is an multi-chip laser diode (MCL) laser assembly. The MCL laser assembly includes a MCL laser and a laser driving circuit board disposed on a periphery of the MCL laser. The MCL laser includes a substrate and a plurality of laser-emitting chips that are encapsulated on the substrate to form an area laser source. The MCL laser as shown in FIG. 5A includes a metal substrate 1102, and a plurality of laser-emitting chips are encapsulated on the metal substrate 1102 (not shown in FIG. 5A). The plurality of laser-emitting chips may be connected in series for driving, or may be connected in parallel in rows or columns for driving. The plurality of laser-emitting chips may be arranged in a 4×6 array, or may be arranged in other arrays, such as a 3×5 array, a 2×7 array, a 2×6 array, or a 4×5 array. An overall luminous power of a laser with a different number of arrays is different. There are pins 1103 protruding from two sides of the metal substrate 1102. Each pin is coupled to an electrical signal to drive the laser-emitting chips to emit laser beams. The MCL laser further includes a collimating lens group 1101 covering laser-emitting surfaces of the plurality of laser-emitting chips, and the collimating lens group 1101 is usually fixed by an adhesive. The collimating lens group 1101 includes a plurality of collimating lenses, and the plurality of collimating lenses are usually in one-to-one correspondence with laser-emitting positions of the laser-emitting chips, and correspondingly collimate the laser beams.

Figure 5B:
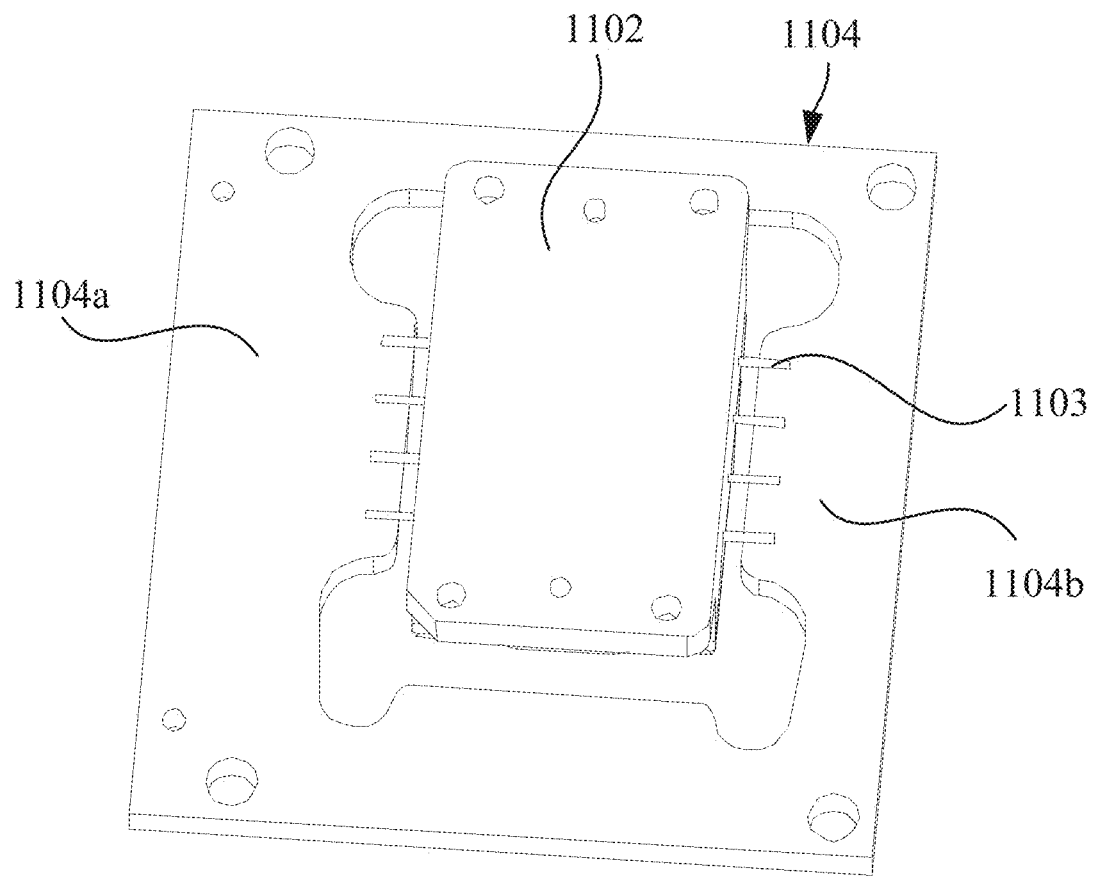
FIG. 5B is a schematic diagram of a circuit package structure of the MCL laser in FIG. 5A.
Figure 5C:
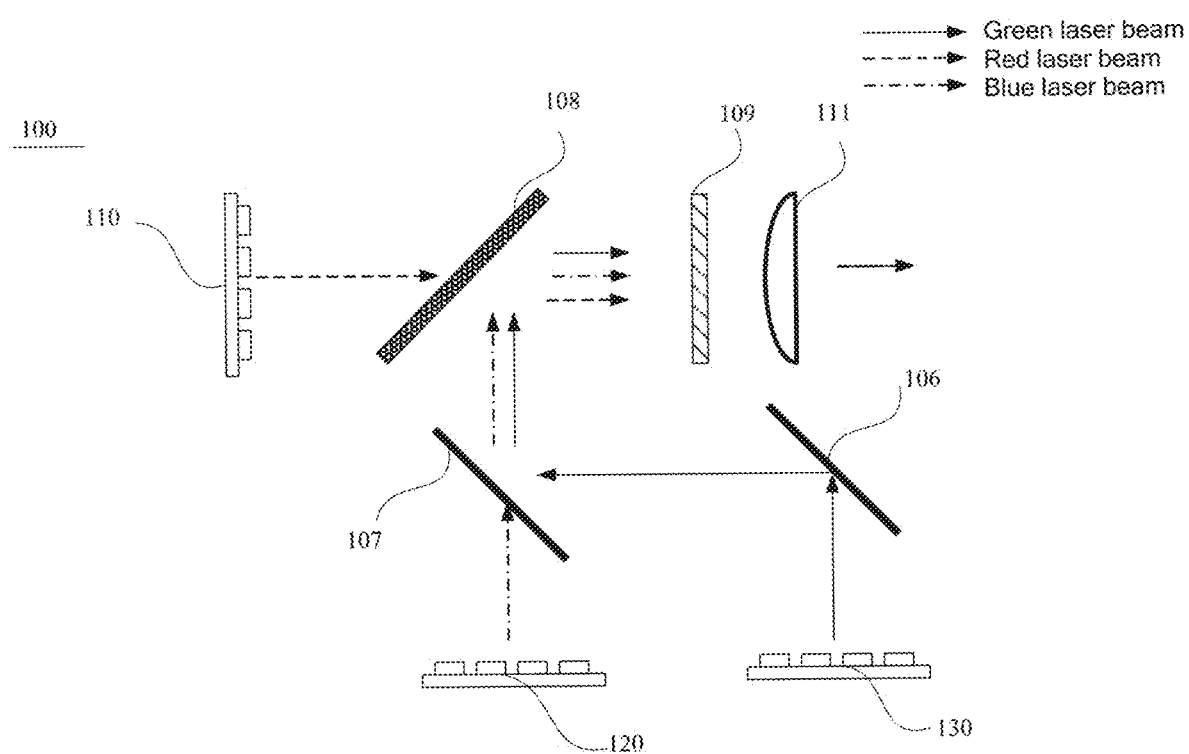
FIG. 5C is a schematic diagram showing a principle of a laser path of a laser projection system, in accordance with some embodiments of the present disclosure.

As shown in FIG. 5B, the laser driving circuit board 1104 is disposed on the periphery of the MCL laser. The laser driving circuit board 1104 has a flat-plate structure, and the laser driving circuit board is substantially parallel to or in a same plane as a laser-emitting surface of the MCL laser. There is at least one pin 1103 on each of the two sides of the MCL laser. Each pin 1103 is soldered onto or plugged into the laser driving circuit board 1104, so that the MCL laser is electrically connected to the laser driving circuit board 1104. The laser driving circuit board 1104 is configured to provide a driving signal to the MCL laser. In some examples, the laser driving circuit board is integrally formed and surrounds the metal substrate 1102 of the MCL laser. In some other examples, the laser driving circuit board includes two independent circuit boards. That is, the laser driving circuit board includes a first portion 1104a and a second portion 1104b, and the MCL laser is enclosed by the two portions. In this way, a laser assembly encapsulated also substantially has a flat-plate structure, which facilitates to installation, saves space and is beneficial to miniaturize the laser source. Moreover, a back side of the laser assembly may also be connected to the heat conducting component or the heat pipe in a surface contact manner, which may increase the heat conducting area.

Figure 3A:
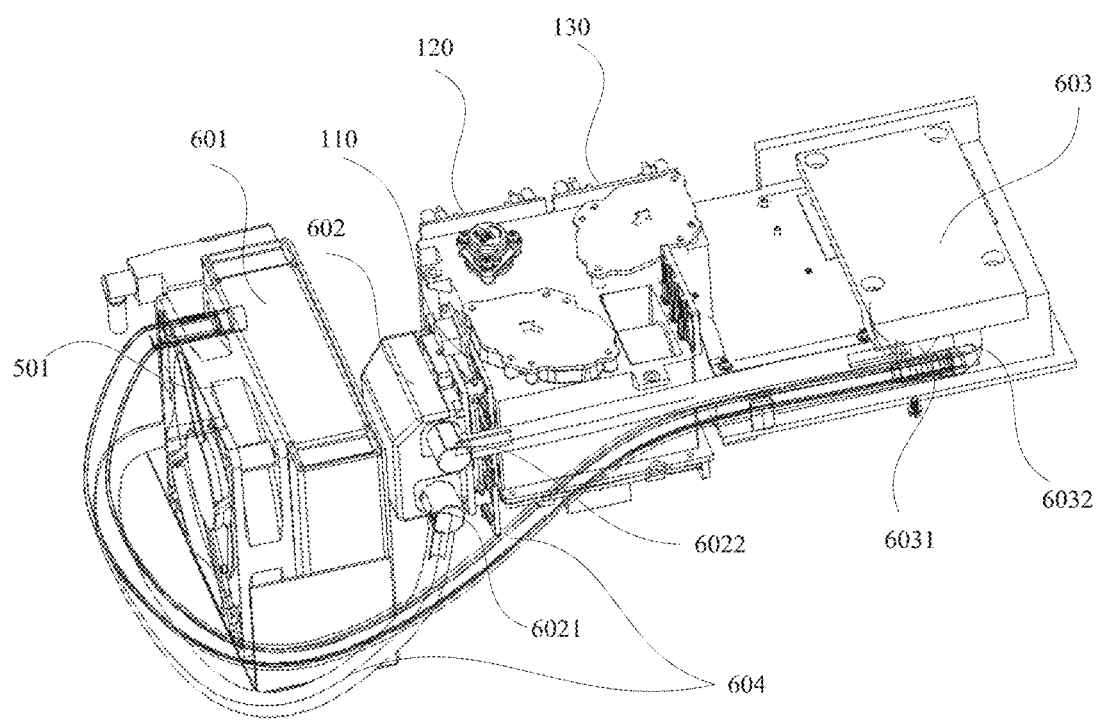
FIG. 3A is a schematic diagram showing a structure of a liquid-cooling heat dissipation device shown in FIG. 1B.

FIG. 3A is a schematic diagram of a first heat dissipation system of the laser projection apparatus. As shown in FIG. 3A, a liquid-cooling heat dissipation device including a first cooling head 602 and a cooling drain 601 is provided at a side of the laser source housing, and a first fan 501 is provided to cool the cooling drain 601 in an air-cooling manner. The red laser assembly 110 is installed on a side wall (i.e., the first side wall) of the laser source housing opposite to the first cooling head 602, and the blue laser assembly 120 and the green laser assembly 130 are installed on another side wall (i.e., the second side wall being perpendicular to the first side wall) of the laser source housing. The red laser assembly 110 is in contact with the first cooling head 602 to dissipate heat in a liquid-cooling manner. For example, a heated area of the first cooling head 602 is greater than a heat conducting area of the back side of the red laser assembly 110, which may accelerate a conduction of heat.

In the liquid-cooling heat dissipation device described above, the first cooling head 602 and the cooling drain 601 are connected through pipe(s), and the cooling medium flowing through the first cooling head 602 takes heat of a heat source component (such as the red laser assembly 110) away and flows back to the cooling drain 601. The cooling medium at the cooling drain 611 may be cooled by the first fan 501. The cooled cooling medium, such as water that is usually used, flows back to the first cooling head 602 again, and is sequentially circulated to conduct heat to the heat source (such as the red laser assembly 110). For example, in the liquid-cooling heat dissipation system, the first heat dissipation device further includes a pump configured to drive the cooling medium in the liquid-cooling heat dissipation system to keep flowing. In some embodiments of the present disclosure, an integrated arrangement of the pump and the first cooling head 602 is beneficial to reduce a volume of the component.

For example, the liquid-cooling heat dissipation system of the laser projection apparatus in some embodiments of the present disclosure further includes a liquid replenisher (not shown) configured to replenish liquid to the liquid-cooling heat dissipation device, so that a pressure of the liquid in the first heat dissipation device is greater than a pressure outside the first heat dissipation device. In this way, external air will not enter a circulation system even if there is a volatilization of the cooling medium or a poor air-tightness of a connection between the pipe(s) and other components, so that it will not cause noise in the circulation system, will not cause a cavitation phenomenon, and will not damage the device.

The cooling head (such as a first cooling head) and the cooling drain both have a smaller volume than a conventional heat dissipation fin, and both have more selections in terms of shape, structure and mounting position. Since the cooling head and the cooling drain are connected through the pipe(s), and the cooling head and the cooling drain are always in a single circulation system, the cooling drain may be disposed proximate to the cooling head, or have other relative positional relationships with the cooling head, which is determined by space of the laser projection apparatus. Therefore, the liquid-cooling heat dissipation device has more selections compared with the air-cooling heat dissipation device.

Figure 3B:
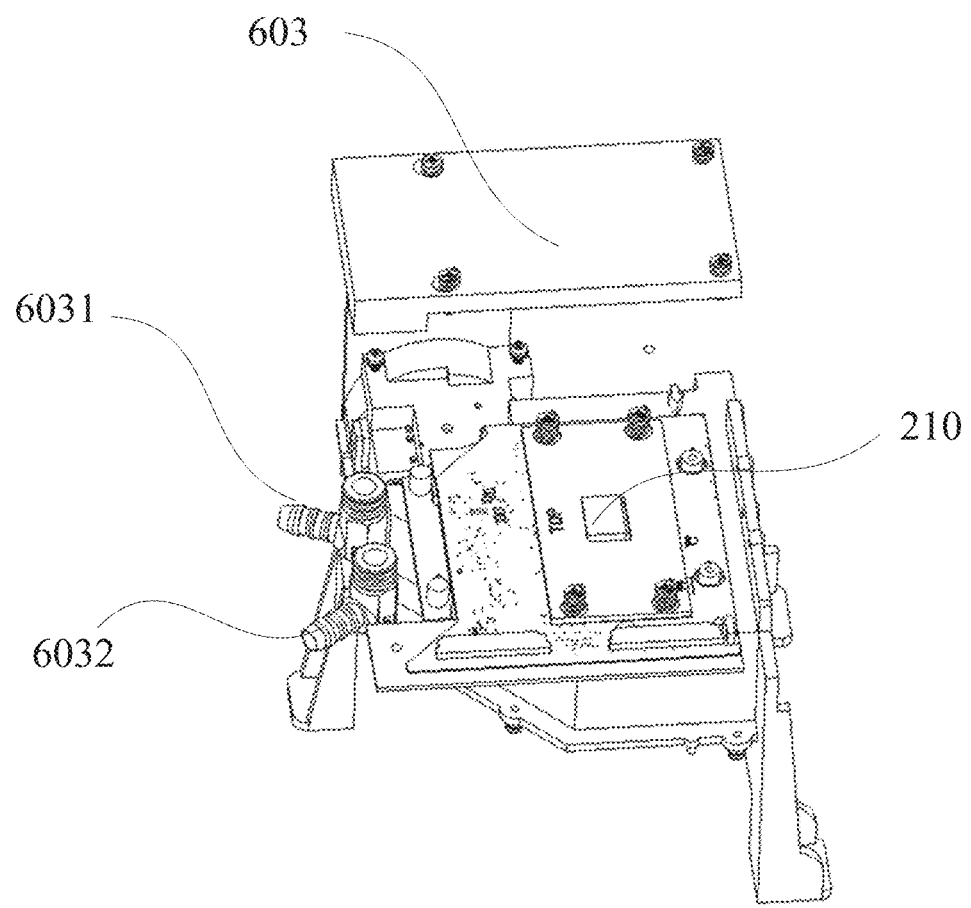
FIG. 3B is a schematic exploded diagram of the structure of a DMD chip and a second cold head in FIG. 3A.

In some embodiments, referring to FIGS. 1B, 3A, and 3B, the liquid-cooling heat dissipation device further includes a second cooling head 603. The second cooling head 603 is connected to a liquid-cooling circulation system consisting of the first cooling head 602 and the cooling drain 601 through pipe(s). The core device in the optical engine 200, that is, a laser valve (such as a DMD chip) dissipates heat through the second cooling head 603 in a circular manner. For example, as shown in FIG. 3B, the second cooling head 603 is disposed on a back side of the laser valve 210 in the optical engine 200; or, the second cooling head 603 is in contact with the laser valve 210 through the heat conducting plate. In this way, the second cooling head 603 may be in contact with a heat conducting area of a back side of the laser valve 210 to exchange heat.

For example, referring to FIGS. 3A and 3B, the first cooling head 602 has a first cooling medium inlet 6021 and a first cooling medium outlet 6022. The second cooling head 603 corresponding to the laser valve 210 (such as the DMD chip) has a second cooling medium inlet 6031 and a second cooling medium outlet 6032. The first cooling medium inlet 6021 is connected to the cooling drain 601, the first cooling medium outlet 6022 is connected to the second cooling medium inlet 6031, and the second cooling medium outlet 6032 is connected to the cooling drain 601. The cooling medium cooled by the cooling drain 601 sequentially flows through the first cooling head 602 and the second cooling head 603 and then returns to the cooling drain 601. It should be noted that, a heat dissipation requirement of the laser valve 210 (such as the DMD chip) is lower than that of the laser assembly. Therefore, in these embodiments, the requirement for the heat transfer and heat conductivity of the second cooling head 603 is lower than that of the first cooling head 602, and size of a heated area of the second cooling head 603 and a heated area of the back side of the laser valve 210 (such as the DMD chip) is not limited.

In some embodiments of the present disclosure, both the red laser assembly 110 and the laser valve 210 (such as the DMD chip) adopt a liquid-cooling heat dissipation manner. The lower-temperature cooling medium flows from the cooling drain 601 into the first cooling medium inlet 6021 of the first cooling head 602 through pipe(s) 604, and the cooling medium flows through the first cooling head 602 to take away heat generated by the red laser assembly 110 and then flows out of the first cooling medium outlet 6022. Since the first cooling medium outlet 6022 of the first cooling head 602 is in communication with the second cooling medium inlet 6031 of the second cooling head 603, the cooling medium flowing out of the first cooling medium outlet 6022 flows into the second cooling medium inlet 6031 of the second cooling head 603. In this way, the cooling medium flows through the second cooling head 603 and takes away the heat generated by the DMD chip, then flows out of the second cooling medium outlet 6032, and flows back to the cooling drain 601 through the pipe(s) 604 to be cooled again. In some embodiments of the present disclosure, a heat power of the red laser assembly is 60 W, and an operating temperature is less than or equal to 50° C. A heat power of the DMD chip is 30 W, and an operating temperature is less than or equal to 65° C. It can be seen that the operating temperature of DMD chip is lower than that of the red laser assembly. Therefore, temperature of the cooling medium is increased after heat exchange with the red laser assembly, but is still lower than the operating temperature requirement of the DMD chip, so that the cooling medium may still exchange heat with the DMD chip by using of a temperature difference.

As shown in FIG. 3B, the second cooling head 603 is located above the laser valve 210 (such as the DMD chip), and may be in contact with a heat conducting region of the back side of the DMD chip. Since the DMD chip has a small size, and an area of the heat conducting region of the back side of the DMD chip is also small. A heat exchange efficiency of the second cooling head 603 is very high, so that the second cooling head 603 is able to quickly conduct out concentrated heat in a small area, which is conducive to stabilize the operating temperature of the DMD chip and reduce a rate of a temperature rise. Moreover, a conventional heat dissipation fin has a length of several centimeters and a width of several centimeters, and has a large volume. In addition, the conventional heat dissipation fin is usually used with a fan. As a result, a volume of a whole system including the conventional heat dissipation fin is increased, which is inconvenient for an arrangement of components in the system. Compared with the heat dissipation fin, the cooling head in some embodiments of the present disclosure has a plate-shaped structure and a small thickness. Moreover, the DMD chip also adopts a liquid-cooling heat dissipation manner, and shares a single liquid-cooling heat dissipation device with the red laser assembly, and the DMD chip is located downstream of the red laser assembly, which simultaneously meet a low operating temperature requirement of the red laser assembly and a high operating temperature requirement of the DMD chip relative to the red laser assembly. For a liquid-cooling heat dissipation device, too many components do not need to be added, and a heat dissipation efficiency of the DMD chip is improved and a volume of the heat dissipation system is greatly reduced compared with the prior DMD chip adopting an air-cooling heat dissipation manner, so that both the requirement for heat dissipation and the requirement to reduce the volume of the apparatus may be taken into account.

Figure 4A:
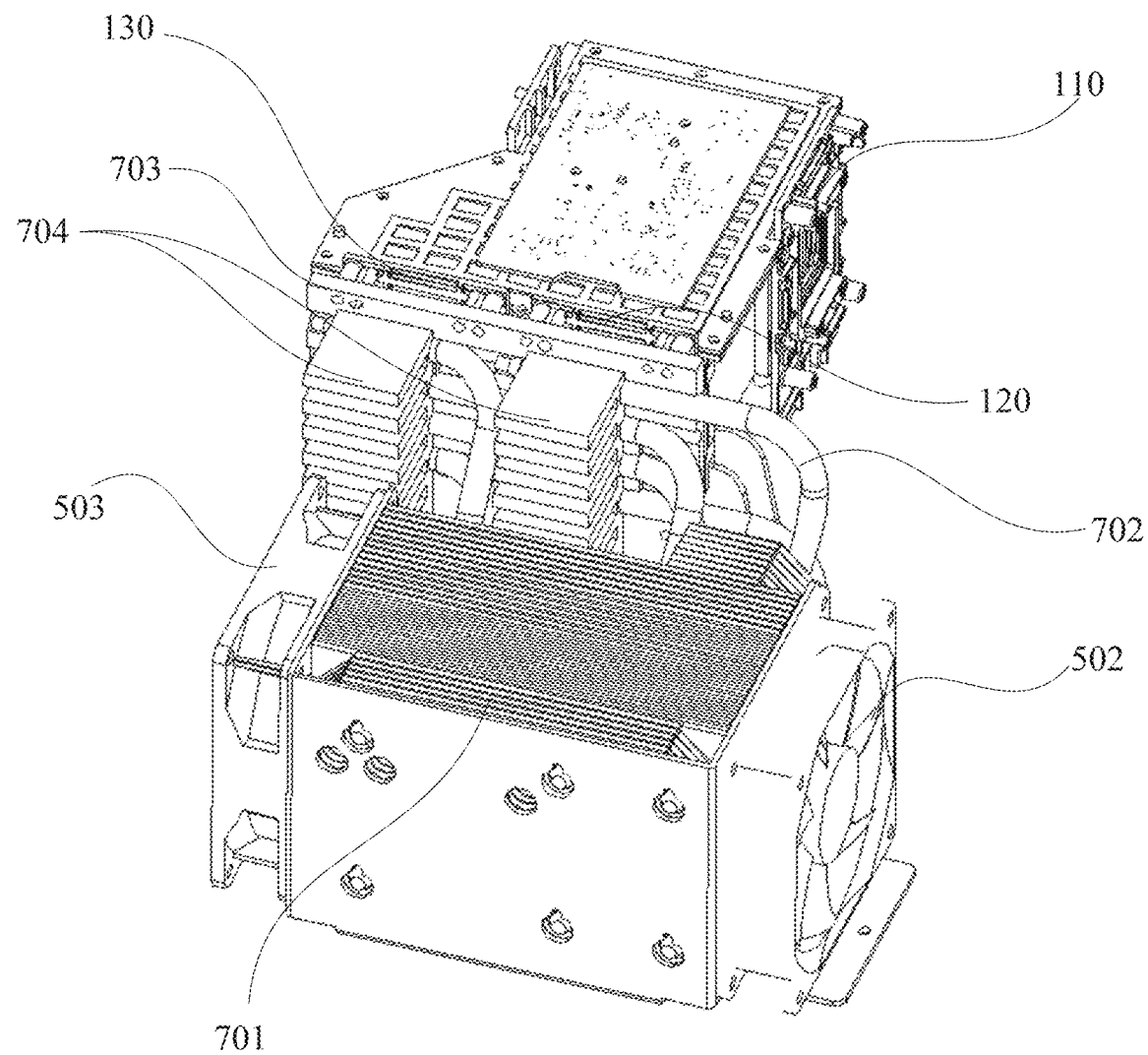
FIG. 4A is a schematic diagram showing an air-cooling heat dissipation device, in accordance with some embodiments of the present disclosure.

Referring to FIG. 4A, in some embodiments of the present disclosure, second laser assemblies (such as the blue laser assembly 120 and the green laser assembly 130) is disposed on a same side wall of the laser source housing and shares a single heat dissipation fin structure. For example, heat sinks on backs of the blue laser assembly 120 and the green laser assembly 130 are in contact with the heat pipes 702 through the heat conducting plate 703, and the heat pipes 702 extend into the heat dissipation fins 701. The heat conducting plate 703 may have two separate portions respectively for the blue laser assembly 120 and the green laser assembly 130 to respectively conduct heat for different laser assemblies. Or, the heat conducting plate 703 may have a whole structure, which facilitates an installation. In some embodiments of the present disclosure, the heat conducting plate 703 has a whole structure.

Figure 4B:
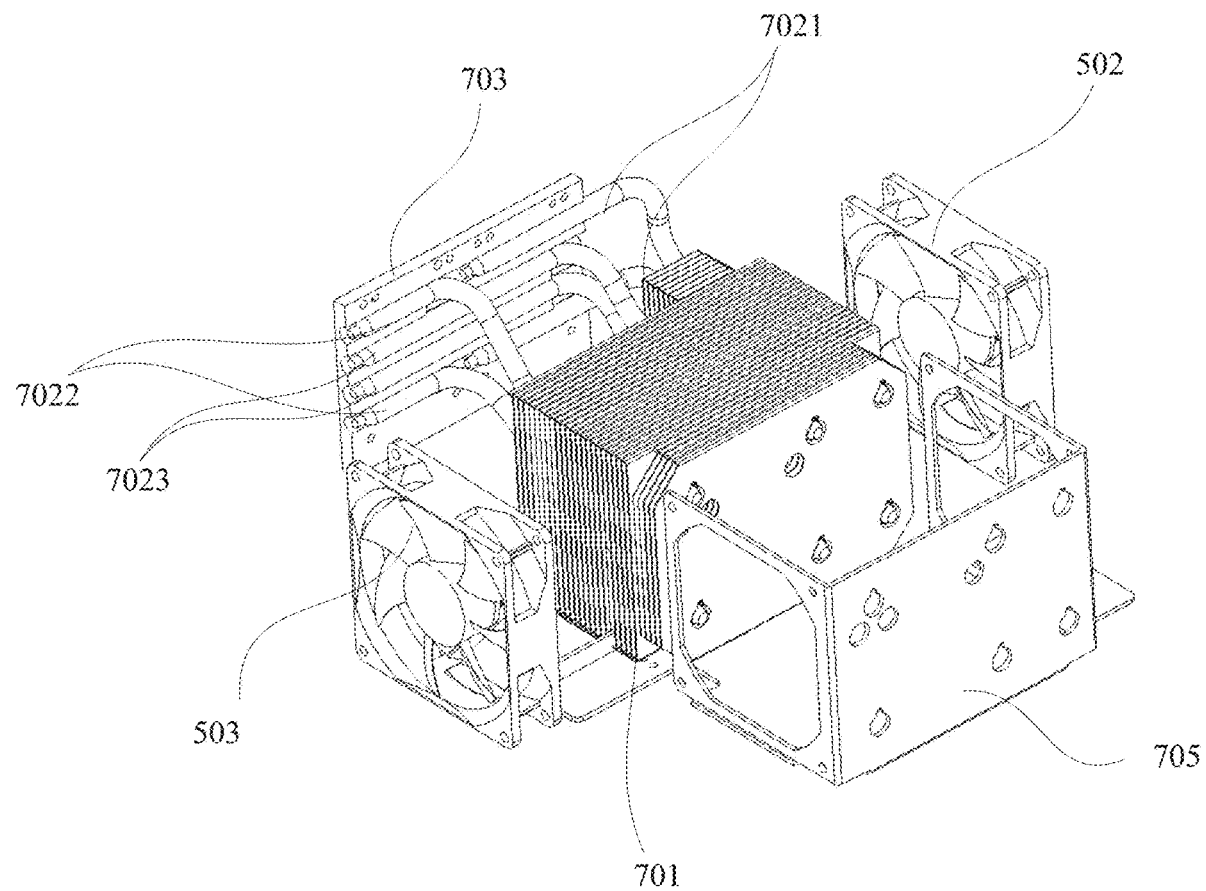
FIG. 4B is a schematic exploded diagram of a portion of the structure of the air-cooling heat dissipation device in FIG. 4A.

There may be a plurality of heat pipes 702, and a plurality of through holes are disposed inside the heat dissipation fin 701 for inserting the plurality of heat pipes 702. As shown in FIGS. 4A and 4B, a portion of the plurality of heat pipes 702 is in contact with the heat conducting plate 703, which increases a contact area between the heat pipes 702 and the heat conducting plate 703, and another portion of the plurality of heat pipes 702 is inserted into the through holes of the first heat dissipation fins 701 after being bent.

As shown in FIG. 4B, a side of the heat conducting plate 703 in contact with the laser assembly is planar, and a side connected with the heat pipes is provided with grooves for accommodating a portion of each heat pipe, so that contact areas with the heat pipes may be increased.

In some embodiments, as shown in FIG. 4B, a first set of heat pipes 7021 is provided in a heat conducting region corresponding to the blue laser assembly. A portion of the first set of heat pipes 7021 is fixed and in contact with the heat conducting plate 703, specifically in contact with a region of the heat conducting plate 703 corresponding to the blue laser assembly, and another portion of the first set of heat pipes 7021 is inserted into the first heat dissipation fins 701 after being bent. A second set of heat pipes 7022 and a third set of heat pipes 7023 are provided in a heat conducting region corresponding to the green laser assembly. A portion of the second set of heat pipes 7022 is in contact with a region of the heat conducting plate 703 corresponding to the green laser assembly, and another portion of the second set of heat pipes 7022 is inserted into the first heat dissipation fins 701 after being bent. And, a portion of the third set of heat pipes 7023 extends from the region of the heat conducting plate 703 corresponding to the green laser assembly to a region of the heat conducting plate 703 corresponding to the blue laser assembly (that is, the third set of heat pipes 7023 is in contact with both the region of the heat conducting plate corresponding to the blue laser assembly and the region of the heat conducting plate corresponding to the green laser assembly), and is inserted into the first heat dissipation fins 701 after being bent. That is, the blue laser assembly and the green laser assembly have respective sets of heat pipes, and also have a common set of heat pipes (i.e., the third set of heat pipes 7023). In this way, the number of heat pipes may be reduced, and heat dissipation requirements of the two laser assemblies may also be met. In some examples, each of the first set of heat pipes 7021, the second set of heat pipes 7022, and the third set of heat pipes 7023 includes two heat pipes, so that six heat pipes are arranged. And heat of the blue laser assembly and the green laser assembly may be conducted and dissipated through four heat pipes, which improve a heat transfer efficiency of the laser assembly.

For example, referring to FIG. 4B, there are a plurality of first heat dissipation fins 701, and the plurality of first heat dissipation fins 701 are fixed to the apparatus housing through a support 705.

Figure 4C:
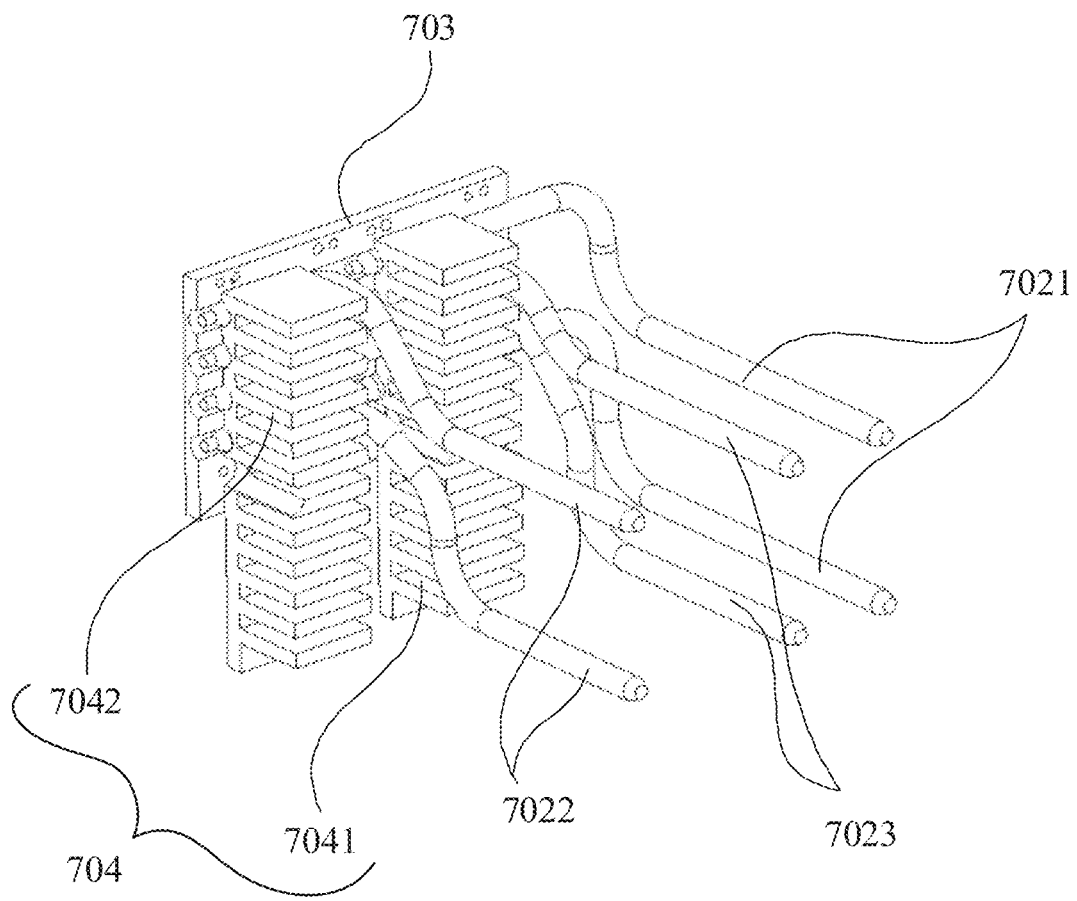
FIG. 4C is a schematic exploded diagram of another portion of the structure of the air-cooling heat dissipation device in FIG. 4A.

As can be seen from the foregoing description, the heat pipe is connected to the first heat dissipation fins after being bent. A certain space is formed at a bending position of the heat pipe. In order to improve a space heat dissipation efficiency, in some embodiments, as shown in FIGS. 4A and 4C, a second heat dissipation fin 704 is further disposed at contact regions of the heat pipes 702 and the heat conducting plate 703. The second heat dissipation fin 704 is disposed between the plurality of heat pipes 702 and the first heat dissipation fins 701, and is in contact with the plurality of heat pipes 702 and the heat conducting plate 703. For example, the second heat dissipation fin 704 may include an aluminum extrusion fin.

For example, the heat conducting plate 703 is provided with first grooves for accommodating the heat pipes 702, and a portion of the plurality of heat pipes 702 is embedded in the first grooves. Or, the second heat dissipation fin 704 is provided with second grooves for accommodating the heat pipes 702, and a portion of the plurality of heat pipes 702 is embedded in the second grooves. For another example, a plurality of heat pipes 702 are sandwiched between the heat conducting plate 703 and the second heat dissipation fin 704, and the plurality of heat pipes 702 sandwiched between the second heat dissipation fin 704 and the heat conducting plate 703 may be located in both the second grooves and the first grooves.

For example, as shown in FIG. 4C, the second heat dissipation fin 704 includes a first fin portion 7041 corresponding to a heat conducting region of the blue laser assembly, and a second fin portion 7042 corresponding to a heat conducting region of the green laser assembly. One end is fixedly in contact with the heat conducting plate 703, the first set of heat pipes 7021, and the third set of heat pipes 7023, and another end of the first fin portion 7041 has a fin structure. Similarly, one end is fixedly in contact with the heat conducting plate 703, the third set of heat pipes 7023 and the second set of heat pipes 7022, and another end of the second fin portion 7042 has a fin structure. In this way, heat of the blue laser assembly and the green laser assembly may be transferred to the second heat dissipation fin 704 (such as the aluminum extrusion heat dissipation fin) for heat dissipation through the heat conducting plate and the plurality of heat pipes. Another end of the second heat dissipation fin 704 is exposed to the air and exchanges heat with the air. In this way, a space formed by the bending regions of the heat pipes may be effectively utilized by disposing the second heat dissipation fin 704, which may increase a dissipation area of the laser assemblies in a limited space, and greatly increase an utilization rate of the dissipation space.

In some embodiments of the present disclosure, a heat power of the green laser assembly is greater than that of the red laser assembly, and a heat power of the red laser assembly is greater than that of the blue laser assembly. For example, the heat power of the green laser assembly is 110 W, the heat power of the red laser assembly is 60 W, and the heat power of the blue laser assembly is 40 W. It can be seen that, the heat power of the green laser assembly is higher and the heat power of the blue laser assembly is lower. Moreover, an operating temperature of the green laser assembly is controlled to be less than or equal to 65° C., and an operating temperature of the blue laser assembly is controlled to be less than or equal to 70° C. In this way, a phenomenon that a temperature rise of the green laser assembly is fast due to a high heat power may be well restrained.

In the laser projection apparatus, the laser source 100 is a pure three-color laser source, and the laser assemblies of different colors included in the laser source have different operating temperature requirements. As mentioned earlier, in these embodiments of the present disclosure, the operating temperature of the red laser assembly is less than or equal to 50° C., the operating temperature of the blue laser assembly is less than or equal to 70° C., and the operating temperature of the green laser assembly is less than or equal to 65° C. An operating temperature of the laser valve (such as the DMD chip) in the optical engine is usually controlled at approximately 70° C., and is controlled less than or equal to 65° C. in some embodiments of the present disclosure. An operating temperature of the lens is usually controlled below 85° C. Since operating temperatures of different electronic devices are different, an operating temperature of the circuit board is usually between 80° C. and 120° C. It will be seen that, temperature tolerance values of the optical portions are different from temperature tolerance values of the circuit portions, and operating temperature tolerance values of the optical portions are usually lower than those of the circuit portions. Therefore, the airflow is blown from the optical portions toward the circuit portions, in this way, a purpose of heat dissipation of the two portions may be achieved, and respective normal operations may be maintained.

In the first heat dissipation path a, as shown in FIGS. 1B, 3A and 3B, the first fan 501 cools the cooling drain 601. The cooling medium circulates in the cooling drain 601, the first cooling head 602 and the second cooling head 603, so that the red laser assembly and the DMD chip may be cooled down by the first cooling head 602 and the second cooling head 603 respectively. Thereafter, the first fan 501 blows the airflow carrying a certain amount of heat toward the optical engine 200. As mentioned earlier, since the temperature of the red laser assembly is controlled between 45° C. and 50° C., for example, in a case where the operating temperature is controlled at 45° C., the liquid-cooling manner is used. A difference between a surface temperature of the cooling drain and a surface temperature of the cooling heads (i.e., the first cooling head 602 and the second cooling head 603) is controlled within a range of 1° C. to 2° C., inclusive. That is, if the surface temperature of the cooling head is 45° C., the surface temperature of the cooling drain is within a range of 43° C. to 44° C., inclusive. Herein, a surface temperature of the first cooling head 602 refers to a temperature of a surface where the first cooling head 602 is in contact with a heat sink of the red laser assembly. And a surface temperature of the second cooling head 603 refers to a temperature of a surface where the second cooling head 603 faces the DMD chip. For example, the first fan 501 takes in air with an ambient temperature, and the ambient temperature is usually within a range of 20° C. to 25° C., inclusive. The heat of the cooling drain is dissipated in the air-cooling manner, and the surface temperature of the cooling drain is reduced to 43° C. Therefore, temperature of hot airflow flowing from the laser source to the optical engine is less than or equal to 50° C. Since the operating temperature of the circuit boards may be above 80° C., the hot airflow flowing through the laser valve is also cold airflow relative to the operating temperature of the circuit boards, which may still dissipate heat for a portion of the circuit boards. A fourth fan 504 is also provided at the air outlet of the apparatus housing downstream of the first heat dissipation path a. The fourth fan 504 discharges the hot airflow flowing through the circuit boards 400 out of the apparatus housing to increase a flow rate of the airflow in the first heat dissipation path a. In this way, the hot airflow may be rapidly discharged to meet lower operating temperature requirements of the red laser assembly and the laser valve (e.g., the DMD chip) relative to devices such as lenses and circuit boards.

In the second heat dissipation path b, as shown in FIG. 1B, a second fan 502 is provided upstream of the first heat dissipation fin 701, and the lens 300 is located downstream of the first heat dissipation fin 701. In addition, a third fan 503 may be provided between the first heat dissipation fin 701 and the lens 300 to increase a wind pressure. Since operating temperatures of the blue laser assembly and the green laser assembly are below 65° C. and a temperature of the first heat dissipation fins needs to be within a range of 62° C. to 63° C., inclusive, a difference between the temperature of the first heat dissipation fins 701 and temperatures of the heat sinks of the laser assemblies is within a range of 2° C. to 3° C., inclusive. The heat dissipation fins 701 have a plurality of sets of air channels that are parallel. After first airflow from the second fan 502 flows through surfaces of these heat dissipation fins 701 and the air channels inside these heat dissipation fins 701, second airflow is formed, and the second airflow is then blown toward the lens 300. The second airflow may flow along a space around a housing of the lens 300 and a space at a bottom of the housing of the lens 300, and take away heat on a surface of the housing of the lens 300.

Similarly, the operating temperature of the lens is controlled at 85° C., and the temperature of the first heat dissipation fins is 63° C., which is still lower than the operating temperature of the lens. Therefore, airflow after passing through the heat dissipation fins is still cold airflow relative to the lens, and may be used for dissipating heat of the lens. An operating temperature of the circuit boards is usually higher than the operating temperature of the lens. Therefore, airflow after cooling the lens is still cold airflow relative to most of the circuit boards, which may still continue to flow through a plurality of circuit boards for heat dissipation.

In some embodiments of the present disclosure, in the first heat dissipation path a, operating temperature threshold values of the cooling drain, the laser valve, and the circuit boards are progressively increased. In the first heat dissipation path b, operating temperature threshold values of the first heat dissipation fins, the lens, and the circuit boards are progressively increased. Arrangement manners of the above structures are also beneficial to design the heat dissipation paths. In this way, the airflow for heat dissipation may flow from a component with a low operating temperature threshold value to a component with a high operating temperature threshold value. In a same heat dissipation path, heat of a plurality of heat source components may be dissipated in sequence, which may not only meet heat dissipation requirements of the plurality of heat source components, but also improve a heat dissipation efficiency of the whole laser projection apparatus.

It should be noted that, the first fan may also be disposed between the cooling drain and the second cold head. In this case, the first fan is an air intake fan for the cooling drain.

In the heat dissipation path a or the heat dissipation path b, the airflow substantially flows in a linear manner, and rarely detours and turns, which may reduce the resistance of the airflow, and facilitates the airflow carrying the heat to flow away at a fast flow velocity, and improves a heat dissipation effect for the heat source components.

In some embodiments of the present disclosure, operating temperature threshold values of the laser assemblies, the laser valve, the lens, and the plurality of circuit boards are progressively increased. An arrangement manner of the above structures is also beneficial to design the heat dissipation paths. In this way, the airflow for heat dissipation may flow from a component with a low operating temperature threshold value to a component with a high operating temperature threshold value. In a same heat dissipation path, heat of a plurality of heat source components may be dissipated in sequence, which may not only meet heat dissipation requirements of the plurality of heat source components, but also improve a heat dissipation efficiency of the whole laser projection apparatus.

According to the laser projection apparatus in the above one or more embodiments, different heat dissipation paths are arranged, and the airflow for heat dissipation sequentially flows through a first laser assembly (such as a red laser assembly) of the laser source, the optical engine and a portion of the plurality of circuit boards located downstream of the optical engine along the first heat dissipation path. The airflow for heat dissipation sequentially flows through a second laser assembly (such as the blue laser assembly and the green laser assembly) of the laser source, the lens, and a portion of the plurality of circuit boards located downstream of the lens along the second heat dissipation path. In this way, on one hand, the airflow for heat dissipation may flow from a component with a low operating temperature threshold to a component with a high operating temperature threshold. In each heat dissipation path, heat of a plurality of heat source components may be dissipated in sequence, and a heat dissipation space is highly utilized. On another hand, by setting different heat dissipation paths, different heat dissipation requirements of a plurality of portions of the laser source (such as the first laser assembly and the second laser assembly) may be met, and a heat dissipation system is small in size, which is conducive to a miniaturization of the whole apparatus.

In the laser projection apparatus provided by the above embodiments, a range of a luminous power of the red laser assembly may be 24 W to 56 W, inclusive, a range of a luminous power of the blue laser assembly may be 48 W to 115 W, inclusive, and a range of a luminous power of the green laser assembly may be 12 W to 28 W, inclusive. For example, the luminous power of the red laser assembly is 48 W, the luminous power of the blue laser assembly is 82 W, and the luminous power of the green laser assembly is 24 W. The laser assemblies of the three colors are all MCL laser assemblies. Compared with a BANK laser assembly, a volume of the MCL laser assembly is smaller at a same luminous power.

According to the above description, in the laser projection apparatus, heat dissipation requirements of the laser source 100 are the most stringent, and the laser source 100 is a portion whose operating temperature needs to be controlled at relatively low in the whole apparatus. The operating temperature of the red laser assembly is lower than the operating temperature of the blue laser assembly and the operating temperature of the green laser assembly, which is determined by a light-emitting principle of the red laser beam. The blue laser beam and the green laser beam are generated by using a gallium arsenide light-emitting material, and the red laser beam is generated by using a gallium nitride light-emitting material. The red laser beam has a low luminous efficiency and generates a great amount of heat. Requirements for a temperature of the light-emitting material of the red laser beam are also very stringent. Therefore, in a case where heat of a laser source component composed of the lasers of the three colors is dissipated, different heat dissipation structures need to be provided according to requirements for temperatures of different laser assemblies. In this way, a laser of each of the three colors may be ensured to be in a good operating state, and service lives of the laser assemblies may be increased, and luminous efficiencies of the laser assemblies may be more stable.

A temperature difference between a hot end and a cold end of the heat source may be controlled at approximately 3° C. by using an air-cooling heat dissipation manner, and a temperature difference controlled by using a liquid-cooling heat dissipation manner may be more accurate and within a smaller range, such as with a range of 1° C. to 2° C., inclusive. Heat of the red laser assembly with a lower operating temperature threshold value is dissipated by using the liquid-cooling manner, and heat of the blue laser assembly and the green laser assembly with relatively higher operating temperature threshold values is dissipated by using the air-cooling manner. In this way, the heat of the laser source may be dissipated with a lower heat dissipation cost in a case of meeting requirements for the operating temperature of the red laser assembly, and a smaller temperature difference control is met, and requirements for rotation speeds of the fans may be reduced. Moreover, a cost of a component using the air-cooling heat dissipation manner is lower than that of a component using the liquid-cooling heat dissipation manner.

Therefore, in the laser projection apparatus in these embodiments of the present disclosure, the heat of the laser source is dissipated by using a mixed manner of the liquid-cooling manner and the air-cooling manner, which may meet the operating temperatures of different laser assemblies, and is economical and reasonable.

Through the above combined heat dissipation structure, the heat of the laser source may be dissipated, thereby ensuring a normal operation of the laser source of the three-color. The laser source emits the laser beams of the three colors to provide a high-quality illumination beam, and the laser beams of the three colors are projected to form a projected image with a high luminance and a good color. Since the laser assemblies of the three colors are arranged at different spatial positions, in a cavity of the laser source housing, a plurality of optical lenses are needed to combine laser beams in different directions, and to perform a laser processing such as homogenization.

In the above embodiments of the present disclosure, the laser valve (such as the DMD chip) may also adopt the liquid-cooling heat dissipation manner, and share a single liquid-cooling circulation system with the red laser assembly. In this way, a temperature reduction of the DMD chip is realized and heat dissipation portions for the laser source and the optical engine are simplified, which reduce a use of the heat dissipation fins and the fans, and a complexity of the liquid-cooling circulating system is not increased, and is conducive to a simplification and a miniaturization of a system structure of the whole apparatus.

Based on the heat dissipation system arrangement, some embodiments of the present disclosure further provide a laser source, which is applied to the laser projection apparatus in the above embodiments.

In the schematic diagram showing a principle of a laser path of a laser source shown in FIG. 5C, the green laser beam emitted from the green laser assembly 130 is incident onto a second laser combining lens 107 after being reflected by a first laser combining lens 106. The blue laser beam emitted from the blue laser assembly 120 transmits the second laser combining lens 107, and the green laser beam is reflected and output by the second laser combining lens 107. In this way, the blue laser beam and the green laser beam may be combined and then output through the second laser combining lens 107.

An output direction of the blue laser beam and the green laser beam that are output through the second laser combining lens 107 is perpendicular to an output direction of the red laser beam emitted from the red laser assembly 110, and the two output directions have a junction. A third laser combining lens 108 is provided at a junction of the three laser beams. The third laser combining lens 108 is able to transmit the red laser beam, and reflect the green laser beam and the blue laser beam. After propagating from the third laser combining lens 108, the laser beams of the three colors are combined to form a single laser beam. The single laser beam enters a homogenizing component 109, and exits from the laser outlet of the laser source after a laser spot thereof shrinking by a converging lens group 111.

For example, the first laser combining lens is a reflector, and the second laser combining lens and the third laser combining lens are both dichroic lenses.

As shown in FIGS. 2B and 5C, the laser-emitting surface of the red laser assembly 110 is disposed facing the first laser outlet 103 of the laser source. The red laser beam output from the laser-emitting surface of the red laser assembly is transmitted once, then passes through the homogenizing element 109 and the converging lens group 111, and finally exits from the first laser outlet. The blue laser beam is transmitted once and reflected once in sequence, then passes through the homogenizing element 109 and the converging lens group 111, and finally exits from the first laser outlet 103. The green laser beam passes through the homogenizing element 109 and the converging lens group 111 after being reflected three times, and then exits from the first laser outlet 103. It will be seen that, before the laser beams output from the first laser outlet 103 of the laser source 100, a laser path of the red laser beam is shorter than laser paths of the blue laser beam and the green laser beam. In this way, a laser loss of the red laser beam during the transmission in the laser path may be reduced. And, without considering an influence of the laser path on the laser loss, a ratio of laser energy of the red laser beam after passing through the third laser combining lens to laser energy of the red laser beam before passing through the third laser combining lens (i.e., a laser energy efficiency) may reach approximately 97%×1=97%. It will be noted that, as for a calculation of the laser energy efficiency of the red laser beam here, a situation in which the red laser beam has a large divergence angle and there is a laser loss of a large angle is not considered, and only influences of the transmittance and the reflectivity of the optical lens are considered.

The arrangements of the laser assemblies of the three colors described above are also beneficial to dissipate heat of the red laser assembly, the blue laser assembly and the green laser assembly according to different heat dissipation requirements. The red laser assembly is very sensitive to temperature, and the operating temperature is usually controlled below 50° C. The operating temperatures of the blue laser assembly and the green laser assembly are higher than that of the red laser assembly. There is a relatively obvious temperature difference between the operating temperatures of the laser assemblies of the two colors and the operating temperature of the red laser assembly, and the operating temperatures of the laser assemblies of two colors are usually controlled between 65° C. to 70° C., inclusive. In this way, as for the blue laser assembly and the green laser assembly with similar temperature control requirements, arranging the blue laser assembly and the green laser assembly together is also beneficial to share the heat dissipation structure for heat dissipation. The red laser assembly is separately located at another position of the laser source housing, and is spaced apart from the blue laser assembly and the green laser assembly by a certain distance, which may reduce heat radiation of the blue laser assembly and the green laser assembly as high-temperature heat sources to the red laser assembly as a low-temperature heat source, and reduce a heat load of the red laser assembly.

The above laser assemblies are all MCL laser assemblies. Compared with the conventional BANK laser assembly, the MCL laser assembly is significantly smaller in size. Therefore, in some embodiments of the present disclosure, the laser source 100 of the laser projection apparatus shown in FIG. 1A has a volume that is significantly smaller than a volume in a case where the conventional BANK laser assembly is used. Thus, more space may be reserved near the laser source 100 and it facilitates a heat dissipation design. For example, positions of a radiator and the fans may be more flexible, and structures such as the circuit boards may also be further provided. And it is also beneficial to reduce a length of the whole laser projection apparatus in a certain direction or a volume of the whole laser projection apparatus.

In the above embodiments, a liquid-cooling and a phase change heat pipe system are simultaneously adopted for heat dissipation of the laser source, so that different operating temperature requirements of the red laser assembly, the blue laser assembly, and the green laser assembly may be met. Moreover, the laser source is located upstream of two parallel heat dissipation paths, and the airflow for heat dissipation may respectively flow from a component with a low operating temperature threshold value to a component with a high operating temperature threshold value. Heat of a plurality of heat source components may be sequentially dissipated in each heat dissipation path, which may meet operating heat dissipation requirements of the plurality of the heat source components, and a heat dissipation efficiency of the whole apparatus is high. Moreover, an apparatus structure of the laser projection apparatus is compact in layout and high in space utilization rate.

For example, the red laser assembly and another two color laser assemblies in the laser source are located in two heat dissipation paths respectively, and heat of the laser assemblies with different temperature control requirements in the laser source may be respectively dissipated. In this way, a heat dissipation efficiency of the laser assemblies may be improved, which is conductive to control temperatures of the laser assemblies with different colors, and make a plurality of components in the projection apparatus be located in different heat dissipation paths, so that the heat dissipation efficiency may be improved.

In some embodiments, the liquid-cooling heat dissipation device and the air-cooling heat dissipation device may be disposed within a space enclosed by the laser source, the optical engine, and the lens, and corresponds to an optical function portion of the projection system, so that a layout is compact, a space utilization rate is high, and a miniaturization of the structure may be realized while a high efficient heat dissipation is realized.

In a structure of the laser source as shown in FIG. 2B, the blue laser assembly 120 and the green laser assembly 130 are installed side by side on a single side wall (i.e., the second side wall) of the laser source housing 102, the red laser assembly 110 is installed on another side wall (i.e., the first side wall) of the laser source housing 102, and the two side walls of the laser source housing 102 are perpendicular to each other. The housing of the laser source 100 is further provided with a plurality of laser combining lenses and a converging lens group therein. For example, the first laser combining lens 106 is disposed to be inclined toward a light-emitting surface of the green laser assembly 130 and reflects the green laser beam to the second laser combining lens 107. The second laser combining lens 107 is disposed to be inclined toward a light-emitting surface of the blue laser assembly 120, and transmits the blue laser beam and reflects the green laser beam to the third laser combining lens 108. The first laser combining lens 106 and the second laser combining lens 107 are arranged substantially in parallel, and are arranged at 45 degrees to light-emitting surfaces of corresponding laser assemblies. The first laser combining lens 106 and the second laser combining lens 107 are fixed on the bottom surface of the laser source housing 102 through bases. In addition, considering an assembly tolerance, installation angles of the first laser combining lens 106 and the second laser combining lens 107 may also be fine-tuned, for example, within a range of plus or minus 3 degrees, inclusive (i.e., −3° to +3°).

The third laser combining lens 108 is disposed to be inclined toward a light-emitting surface of the red laser assembly 110. Here, the third laser combining lens 108 is at an angle of 135 degrees to an optical axis of the red laser beam (that is, the third laser combining lens 108 is substantially perpendicular to the second laser combining lens 107). The third laser combining lens 108 transmits the red laser beam and reflects the blue laser beam and the green laser beam, and combines the laser beams of the three colors and then output the laser beam combined to the converging lens group 111. The third laser combining lens 108 is disposed proximate to the converging lens group 111. Similarly, the third laser combining lens 108 is also fixed on the bottom wall of the laser source housing 102 through a base, and is configured in a manner that an installation angle is adjustable within a range of 3 degrees.

Laser reflectivities of the second laser combining lens and third laser combining lens are both greater than their laser transmittances. For example, the laser reflectivities of the two laser combining lenses may reach 99%, and the laser transmittances of the two laser combining lenses are usually within a range of 95% to 97%, inclusive.

The laser assemblies of the three colors provided by some embodiments of the present disclosure are all MCL laser assemblies. As shown in FIG. 5A, a MCL laser of each MCL laser assembly includes a plurality of laser-emitting chips encapsulated on a metal substrate. Due to different laser-emitting principles, luminous powers of laser-emitting chips of different colors are also different. For example, a luminous power of each green chip is approximately 1 W, and a luminous power of each blue chip is above 4 W. In a case where the lasers of the three colors include a same number of chips, for example, the laser-emitting chips of the lasers of the three colors are encapsulated in a 4×6 array, overall luminous powers of the lasers are also different. For example, the luminous power of the green laser assembly is less than or equal to that of the red laser assembly, and is also less than or equal to that of the blue laser assembly. The luminous power of the red laser assembly is less than or equal to that of the blue laser assembly.

Figure 6A:
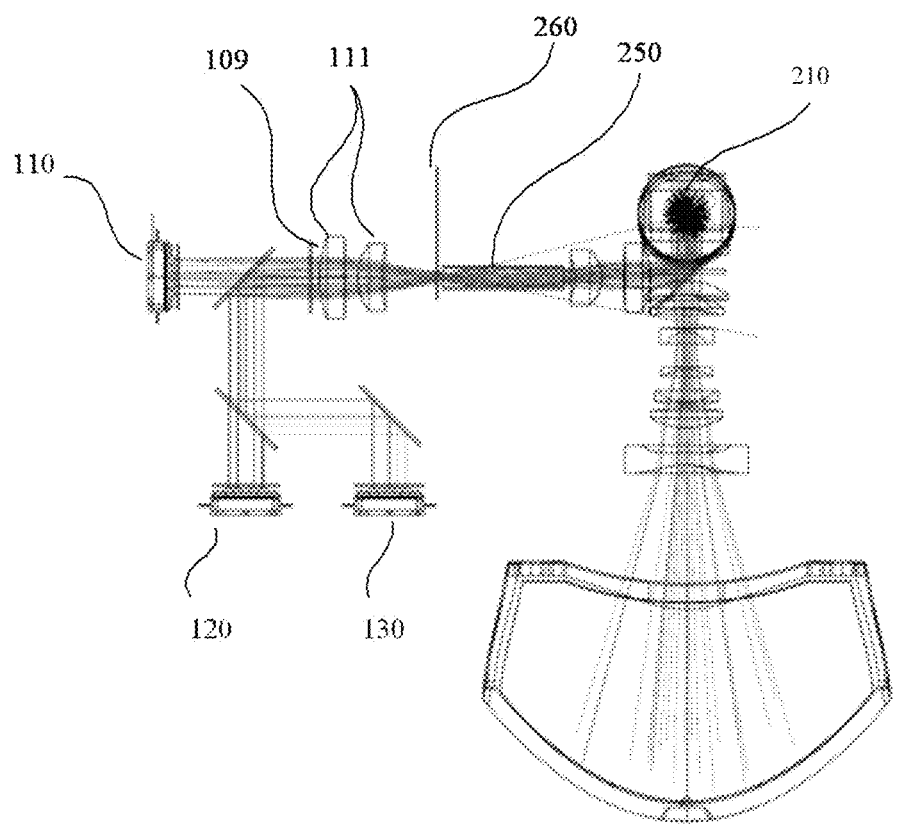
FIG. 6A is a schematic diagram showing a principle of a laser path of another laser projection system, in accordance with some embodiments of the present disclosure.

Since the laser source is a pure three-color laser source, and speckle is a phenomenon unique to the laser beam, in order to obtain a high display quality of the projected image, the laser beams of the three colors needs to be subjected to a speckle elimination treatment. In some embodiments of the present disclosure, as shown in FIG. 6A, a diffusion wheel 260, that is, a rotating diffusion sheet, is disposed between the converging lens group 111 and a laser receiving element 250. The diffusion wheel 260 is further located in a converging laser path of the converging lens group 111. The distance between a wheel surface of the diffusion wheel 260 and a laser-entry surface of a laser receiving element 250 (such as the laser pipe) is approximately a range of 1.5 mm to 3 mm, inclusive, for example, 1.5 mm, 2.0 mm, 2.5 mm or 3 mm. The diffusion wheel is able to diffuse a laser beam in a convergent state, increase the divergence angle of the laser beam, and increase a random phase of the laser beam. Since the human eyes have different sensitivities to speckles of laser beams of different colors, the diffusion wheel may be divided into different regions. For example, the diffusion wheel is divided into a first region and a second region. The first region is configured to transmit the red laser beam, and the second region is configured to transmit the blue laser beam and the green laser beam. A divergence angle of the first region is slightly greater than a divergence angle of the second region. Or, the diffusion wheel is divided into three regions respectively corresponding to the red laser beam, the green laser beam and the blue laser beam. Among the above three regions, a relationship among magnitudes of divergence angles of the regions corresponding to respective colors is as follows: a region corresponding to the red laser beam has the largest divergence angle and a region corresponding to the blue laser beam has the smallest divergence angle. In a case where the diffusion wheel has these corresponding regions, a rotation cycle of the diffusion wheel may be consistent with a cycle of the laser source. Usually, in a case where the diffusion wheel is a single diffusion sheet, the rotation cycle of the diffusion wheel is not particularly limited.

The laser pipe has a certain laser receiving range. For example, laser beams in a range of plus or minus 23 degrees, inclusive (i.e., −23° to +23°) may enter the laser pipe and be used by a rear-end illumination laser path, while other laser beams with large angles are blocked out and become stray laser beams, and the laser loss is formed. A laser-emitting surface of the diffusion wheel is disposed proximate to the laser-entry surface of the laser pipe, which may increase an amount of laser beams received into the laser pipe after diffusion, and improve a laser utilization rate. It should be noted that, in some other examples, the laser receiving component is a fly-eye lens.

There is a homogenizing diffusion sheet 109 in a front-end laser path, after the laser beams emitted by the laser source are homogenized, the laser beams are converged by the converging lens group 111 and the laser beams converged are incident onto the diffusion wheel 260. The laser beams first pass through a stationary diffusion sheet (such as the homogenizing diffusion sheet 109), and then pass through a rotating diffusion sheet (such as the diffusion wheel 260). In this way, based on a homogenization of the laser beams by the stationary diffusion sheet, the laser beams are diffused and homogenized again by the rotating diffusion sheet, which may enhance a homogenization effect of the laser beams, and reduce an energy ratio of laser beams near optical axes to the whole laser beams, thereby reducing a coherence degree of the laser beams, and a speckle phenomenon in the projected image may be greatly alleviated.

In addition, a laser beam emitted by the laser is a linearly polarized laser beam. In laser emission processes of the red laser beam, the blue laser beam and green laser beam, modes of resonant cavity oscillation are different, which causes that a polarization direction of a red linearly polarized laser beam is 90 degrees from that of a blue linearly polarized laser beam and that of a green linearly polarized laser beam. For example, the red laser beam is a P-polarized laser beam, the blue laser beam and the green laser beam are S-polarized laser beams.

In the laser source shown in some of the above embodiments, a polarization direction of the laser beam emitted from the red laser assembly is different from that of the laser beam emitted from the blue laser assembly and that of the laser beam emitted from the green laser assembly. The red laser beam is a P-polarized laser beam, and the blue laser beam and the green laser beam are S-polarized laser beams. The laser beams of the three colors projected by the laser projection apparatus have different polarization directions.

In some embodiments, the blue laser beam and the green laser beam are combined first to a combined laser beam, and then the combined laser beam is combined with the red laser beam. In this case, a half-wave plate may be provided in a laser path after the blue laser beam and the green laser beam are combined and before the combined laser beam is combined with the red laser beam. In some embodiments, the blue laser assembly is disposed adjacent to the green laser assembly. A phase retarder (such as a half-wave plate) is provided in output paths of the blue laser beam and green laser beam before the blue laser beam and green laser beam enter the third laser combining lens, so as to change polarization directions of the blue laser beam and the green laser beam, so that the polarization directions of the blue laser beam and the green laser beam are the same as a polarization direction of the red laser beam, which solves the color cast problem in the projected image due to different polarization directions.

First, a working principle of the phase retarder is introduced. The phase retarder corresponds to a wavelength of a certain color and affects a phase change degree of a laser beam transmitted through a thickness of a crystal. In some embodiments of the present disclosure, the phase retarder is a half-wave plate, also referred to as a λ/2 wave plate. The phase retarder may change a phase of a laser beam of a corresponding color and a corresponding wavelength by π, i.e., 180 degrees, and makes a polarization direction of the laser beam of the corresponding color and the corresponding wavelength be deflected by 90 degrees. For example, the P-polarized laser beam is changed to the S-polarized laser beam, or the S-polarized laser beam is changed to the P-polarized laser beam.

Based on the above principle of the laser path, the half-wave plate may be disposed in a cavity of the laser source, and is located between an inner side of the laser source housing and laser combining lenses corresponding to the laser assemblies. The half-wave plate is fixed by providing a lens base on the bottom wall of the laser source housing.

Figure 6B:
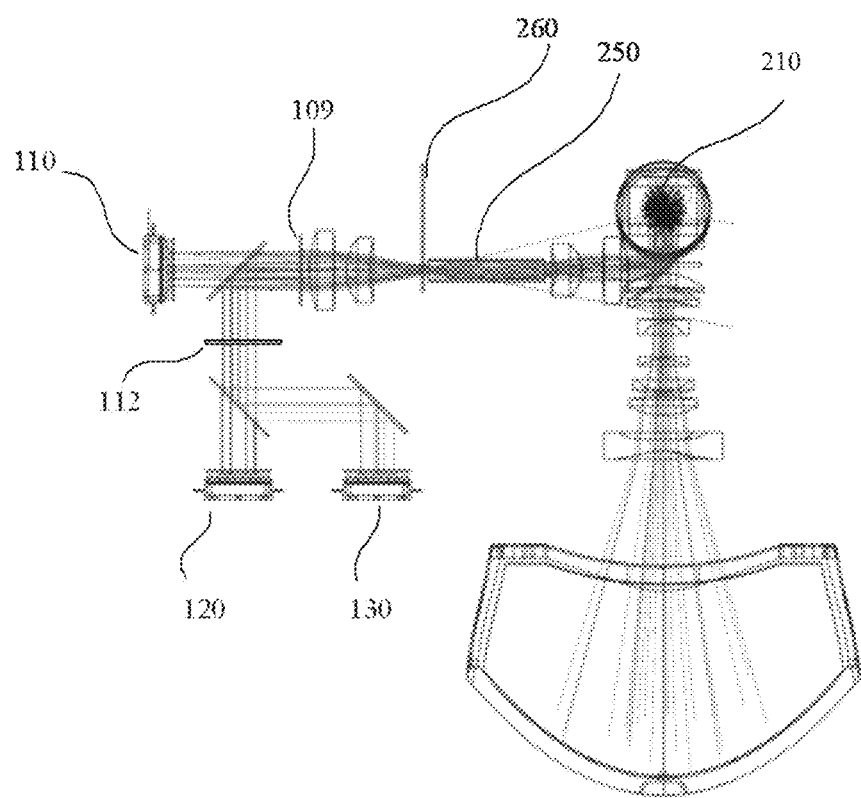
FIG. 6B is a schematic diagram showing a principle of a laser path of yet another laser projection system, in accordance with some embodiments of the present disclosure.

As shown in FIG. 6B, the half-wave plate 112 is disposed between the second laser combining lens 107 and the third laser combining lens 108, and the half-wave plate 112 may transmit the combined laser beam of the blue laser beam and the green laser beam passing through the second laser combining lens 107. Based on the principle of the above laser path, the green laser and the blue laser respectively output a green S-polarized laser beam and a blue S-polarized laser beam. The green S-polarized laser beam is incident on the first laser combining lens 106 and then is reflected, and the blue S-polarized laser beam is incident onto the second laser combining lens 107 and then is transmitted. The second laser combining lens 107 further reflects the green S-polarized laser beam. Here, the second laser combining lens 107 is a dichroic film selected based on wavelengths rather than polarization states. The blue laser beam and the green laser beam that are both S-polarized laser beams are combined by the second laser combining lens 107 to form a combined laser beam, and then the combined laser beam passes through the half-wave plate 112. The polarization directions of the green laser beam and the blue laser beam are changed by the half-wave plate 112, and then the changed laser beams are incident onto the third laser combining lens 108.

It will be noted that, the half-wave plate 112 may be provided for a wavelength of a single laser beam of blue color or green color. For example, the half-wave plate 121 may be provided for a wavelength of the green laser beam. After the green laser beam transmits the half-wave plate 121, the polarization direction of the green laser beam is deflected by 90 degrees, that is, the green laser beam is changed from an original S-polarized laser beam to a P-polarized laser beam. After the blue laser beam transmits the half-wave plate, since the half-wave plate 112 is not set to correspond to a wavelength of the blue laser beam, the polarization direction of the blue laser beam is not deflected by 90 degrees, but is close to the P polarization direction. Or, the half-wave plate 121 may also be set to correspond to a middle value of the center wavelengths of the blue laser beam and the green laser beam, so that the polarization directions of the green laser beam and the blue laser beam are not changed by 90 degrees, but are close to 90 degrees. Although neither the blue laser beam nor the green laser beam is deflected from the S-polarized laser beam to the P-polarized laser beam, neither the blue laser beam nor the green laser beam is in a polarization state of an original S-polarized laser beam. A consistency of processes of processing the laser beams of the three primary colors by the whole system may also be improved, technical problems of uneven chromaticity such as a "color spots" and a "color blocks" presented in a local region on the projected image may be solved, and a principle is not described again.

In the laser source in the above embodiments, the red laser assembly, the blue laser assembly, and the green laser assembly are respectively disposed on different side walls of the laser source housing. The operating temperature threshold value of the red laser assembly is less than or equal to the operating temperature threshold value of the green laser assembly, and the operating temperature threshold value of the green laser assembly is less than or equal to the operating temperature threshold value of the blue laser assembly. If the laser assemblies have a same operating temperature threshold value, for example, both are controlled at 45° C., there will be a problem of excessive heat dissipation of the blue laser assembly and the green laser assembly, heat dissipation resources will be wasted to a certain extent, and product cost control will be increased. In the laser source, the red laser assembly and the laser assemblies of other two colors in the laser source are respectively located in two heat dissipation paths, laser assemblies with different temperature control requirements in the laser source may be respectively subjected to heat dissipation, which is conductive to temperature controls of laser assemblies with different colors, and a heat dissipation scheme is economical and effective. Moreover, the operating temperature threshold values of the laser source are generally higher than that of other portions of the laser projection apparatus, the laser source is disposed upstream of different heat dissipation paths, so that a plurality of components of the laser projection apparatus may be located in different heat dissipation paths, and heat exchange may be continuously carried out by utilizing an allowance of a temperature difference after the laser source dissipates heat. In this way, an utilization rate of a heat dissipation space of the projection apparatus is improved, and it is conductive to realize a miniaturization of the size of the apparatus.

Figure 7A:
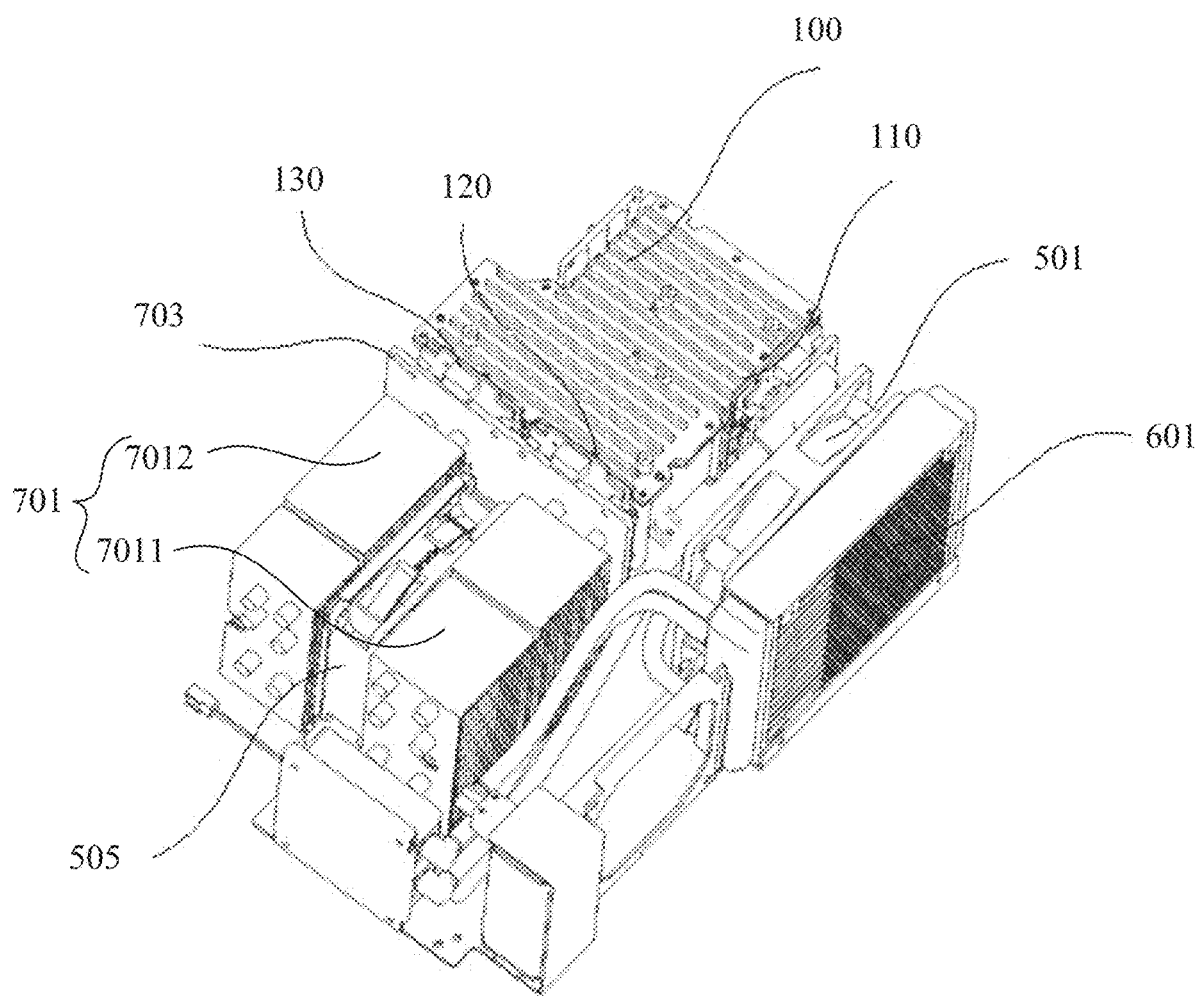
FIG. 7A is a schematic diagram showing a structure of a laser source and a heat dissipation system in a laser projection apparatus, in accordance with some embodiments of the present disclosure.

FIG. 7A shows a schematic diagram of a structure of a laser source and a heat dissipation system in another laser projection apparatus. Different from a structure of the heat dissipation system of the laser source shown in FIG. 4A, the first heat dissipation fins 701 in FIG. 7A include a third fin portion 7011 and a fourth fin portion 7012 corresponding to the blue laser assembly 120 and the green laser assembly 130 respectively. And a fifth fan 505 is provided between the third fin portion 7011 and the fourth fin portion 7012, which may balance an intensity of airflow flowing through the two heat dissipation fin structures, and improve a consistency of the heat dissipation efficiency of the blue laser assembly and the green laser assembly.

Some embodiments of the present disclosure provide another laser projection apparatus. In the laser projection apparatus, a third heat dissipation system replaces the above first heat dissipation system and the second heat dissipation system. The third heat dissipation system includes a liquid-cooling heat dissipation device, an air-cooling heat dissipation device and a fan assembly. The air-cooling heat dissipation device includes a first cooling head, a cooling drain, pipe(s) connecting the first cooling head and the cooling drain, and cooling medium located in the pipe(s). The first cooling head is disposed on a first side wall of a housing of a laser source for dissipating heat of the first laser assembly (e.g., the red laser assembly) on the first side wall. The air-cooling heat dissipation device includes a first heat dissipation fin and a plurality of heat pipes. The plurality of heat pipes are fixed on a second side wall of the housing of the laser source through a heat conducting plate and extend into the first heat dissipation fin so as to dissipate heat of a second laser assembly (e.g., a blue laser assembly and a green laser assembly) on the second side wall. The fan assembly is configured to drive airflow to sequentially flow through the cooling drain, the first heat dissipation fin and a plurality of circuit boards to form a third heat dissipation path.

Figure 7B:
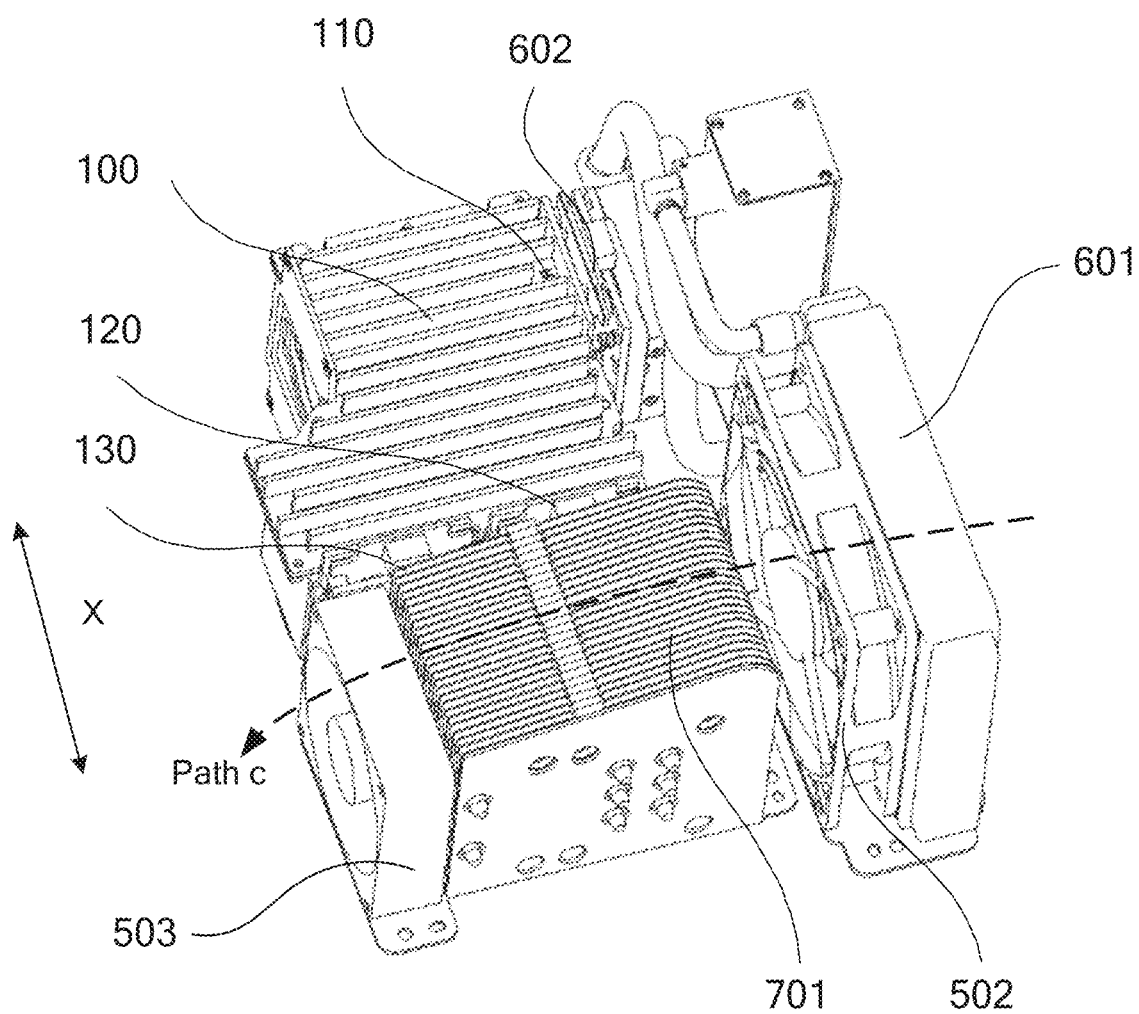
FIG. 7B is a schematic diagram showing a structure of a laser source and a heat dissipation system in another laser projection apparatus, in accordance with some embodiments of the present disclosure.

FIG. 7B shows a schematic diagram of a structure of a laser source and a heat dissipation system in yet another laser projection apparatus. Different from the structures of the heat dissipation systems shown in FIGS. 3A and 4A, a cooling drain 601 that dissipates heat of the red laser assembly 110, and first heat dissipation fins 701 that dissipates heat of the blue laser assembly 120 and the green laser assembly 130 are disposed in a same heat dissipation path c, and a fan assembly, that is, a plurality of fans, is provided in the heat dissipation path c. Here, an arrangement direction of the cooling drain 601 and the first heat dissipation fins 701 in FIG. 7B is substantially perpendicular to a first direction X. For example, a fan for driving the airflow to cool the cooling drain 601 is provided at a side of the cooling drain 601 away from the first heat dissipation fins 701. And, in order to increase a wind pressure on the heat dissipation path c, another fan may be further provided downstream of the first heat dissipation fins 701.

In some embodiments of the present disclosure, the laser projection apparatus includes an apparatus housing, and the apparatus housing is provided with an air inlet and an air outlet. Referring to FIG. 7B, the fan assembly includes at least one of a first fan, a second fan 502, a third fan 503, or a fourth fan. The first fan is located at the air inlet and is configured to drive airflow to flow through the cooling drain 601 and then blow the airflow toward the first heat dissipation fins 701 and a plurality of circuit boards in sequence. The second fan 502 is located at a side of the first heat dissipation fins 701 proximate to the cooling drain 601 (i.e., between the first heat dissipation fins 701 and the cooling drain 601) and is configured to blow the airflow flowing through the cooling drain 601 toward the first heat dissipation fins 701 and the plurality of circuit boards. The third fan 503 is located at a side of the first heat dissipation fins 701 proximate to the plurality of circuit boards and is configured to blow the airflow flowing through the first heat dissipation fins 701 toward a lens and the plurality of circuit boards. The fourth fan is located at the air outlet and is configured to discharge the airflow flowing through the cooling drain 601, the first heat dissipation fins 701, the optical engine, the lens and the plurality of circuit boards out of the apparatus housing.

With the above arrangements, temperature of the airflow flowing through the cooling drain 601 for dissipating heat of the red laser assembly is less than 50° C., which is still below a temperature threshold of the first heat dissipation fins 701 for dissipating heat of the blue laser assembly and the green laser assembly. Therefore, the cooling drain 601 and the first heat dissipation fins 701 may be disposed in a single heat dissipation path. In this way, the airflow for heat dissipation may flow from a component with a low operating temperature threshold value to a component with a high operating temperature threshold value. In a same heat dissipation path, heat of a plurality of heat source components may be dissipated in sequence, which may not only meet heat dissipation requirements of the plurality of heat source components, but also improve a heat dissipation efficiency of the laser projection apparatus.

Heat dissipation of the red laser assembly, the green laser assembly and the blue laser assembly may be realized in the above two laser projection apparatus, specific process and principles may be referenced to the foregoing description and will not be described in detail herein.

Finally, it will be noted that, the above embodiments are only used to illustrate the technical solutions of the present disclosure, but not to limit the same. Although the present disclosure are described in detail with reference to the foregoing embodiments, those of ordinary skill in the art will understand that the technical solutions described in the foregoing embodiments may still be modified, or some or all of the technical features may be equivalently replaced, and these modifications or replacements do not deviate essences of corresponding technical solutions from the scope of the technical solutions of the embodiments of the present disclosure.

What is claimed is:

1. A laser projection apparatus, comprising:
a laser source system, an optical engine, and a lens system that are sequentially connected along a laser beam propagation direction;
a plurality of circuit boards;
a first heat dissipation system, wherein the first heat dissipation system is configured to dissipate heat of a first laser assembly in the laser source system, the optical engine and the plurality of circuit boards, and to make airflow sequentially flow through the first laser assembly, the optical engine and the plurality of circuit boards to form a first heat dissipation path; and
a second heat dissipation system, wherein the second heat dissipation system is configured to dissipate heat of a second laser assembly in the laser source system, the lens system and the plurality of circuit boards, and to make airflow sequentially flow through the second laser assembly, the lens system and the plurality of circuit boards to form a second heat dissipation path.

2. The laser projection apparatus according to claim 1, wherein:
the first heat dissipation system comprises a liquid-cooling heat dissipation device;
the liquid-cooling heat dissipation device comprises a first cooling head, a cooling drain, and a plurality of pipes with cooling medium inside; and
the first cooling head and the cooling drain are connected through at least one of the plurality of pipes, and the first cooling head is disposed on a first side wall of a housing of the laser source system.

3. The laser projection apparatus according to claim 2, wherein:
the liquid-cooling heat dissipation device further comprises a second cooling head; and
the second cooling head is connected to the first cooling head and the cooling drain through at least one of the plurality of pipes, and the second cooling head is disposed on a back surface of a laser valve of the optical engine.

4. The laser projection apparatus according to claim 3, wherein:
the first cooling head comprises a first cooling medium inlet and a first cooling medium outlet;
the second cooling head comprises a second cooling medium inlet and a second cooling medium outlet; and
the first cooling medium inlet is connected to the cooling drain, the first cooling medium outlet is connected to the second cooling medium inlet, and the second cooling medium outlet is connected to the cooling drain.

5. The laser projection apparatus according to claim 2, wherein:
the first laser assembly is installed on the first side wall of the housing of the laser source system;
the first laser assembly comprises a red laser assembly, and
the red laser assembly is in contact with the first cooling head.

6. The laser projection apparatus according to claim 2, further comprising:
an apparatus housing comprising an air inlet and an air outlet; and
wherein the first heat dissipation system further comprises at least one of the following:
a first fan disposed at the air inlet and configured to drive airflow toward the optical engine so as to sequentially flow through the cooling drain, the optical engine, and a portion of the plurality of circuit boards disposed downstream of the optical engine along the first heat dissipation path, or
a fourth fan disposed at the air outlet and configured to discharge airflow from flowing through the cooling drain, the optical engine and the plurality of circuit boards out of the apparatus housing.

7. The laser projection apparatus according to claim 6, wherein:
the first laser assembly comprises a red laser assembly;
the first fan is disposed at a side of the cooling drain away from the first cooling head in the first heat dissipation path; and
the fourth fan is located at a side of the plurality of circuit boards away from the red laser assembly in the first heat dissipation path.

8. The laser projection apparatus according to claim 1, wherein the second heat dissipation system comprises:
an air-cooling heat dissipation device, wherein:
the air-cooling heat dissipation device comprises at least one first heat dissipation fin, a plurality of heat pipes, and a heat conducting plate, and
the plurality of heat pipes are fixed on a second side wall of a housing of the laser source system through the heat conducting plate and extend into the at least one first heat dissipation fin.

9. The laser projection apparatus according to claim 8, wherein:
the second laser assembly is installed on the second side wall of the housing of the laser source system;
the second laser assembly comprises a blue laser assembly and a green laser assembly; and
a side of the second laser assembly is connected with the plurality of heat pipes through the heat conducting plate.

10. The laser projection apparatus according to claim 9, wherein the plurality of heat pipes comprises one of the following:
a first set of heat pipes, wherein the first set of heat pipes is connected to a region of the heat conducting plate corresponding to the blue laser assembly;
a second set of heat pipes, wherein the second set of heat pipes is connected to a region of the heat conducting plate corresponding to the green laser assembly; or
a third set of heat pipes, wherein the third set of heat pipes is connected to a region of heat conducting plate corresponding to the blue laser assembly and the green laser assembly.

11. The laser projection apparatus according to claim 9, wherein:
the at least one first heat dissipation fin comprises:
a third fin portion corresponding to the blue laser assembly, and
a fourth fin portion corresponding to the green laser assembly; and
the laser projection apparatus further comprises a fifth fan disposed between the third fin portion and the fourth fin portion.

12. The laser projection apparatus according to claim 8, wherein the second heat dissipation system further comprises one of the following:
a second fan disposed at a side of the at least one first heat dissipation fin away from the plurality of circuit boards, and configured to drive airflow to sequentially flow through the at least one first heat dissipation fin, the lens system, and a portion of the plurality of circuit boards located downstream of the lens system along the second heat dissipation path, or
a third fan disposed between the at least one first heat dissipation fin and the lens system, and configured to blow airflow from flowing through the at least one first heat dissipation fin toward the lens system.

13. The laser projection apparatus according to claim 8, wherein:
a surface of the heat conducting plate connected to the second laser assembly comprises a plane;
a surface of the heat conducting plate connected to the plurality of heat pipes comprises a plurality of grooves, and a portion of each of the plurality of heat pipes is disposed in a corresponding one of the plurality of grooves; and
each of the at least one first heat dissipation fin comprises a plurality of through holes, and another portion of each of the plurality of heat pipes is disposed in a corresponding one of the plurality of through holes.

14. The laser projection apparatus according to claim 8, wherein the air-cooling heat dissipation device further comprises:
- a second heat dissipation fin disposed between the plurality of heat pipes and the at least one first heat dissipation fin, and in contact with the plurality of heat pipes and the heat conducting plate.

15. The laser projection apparatus according to claim 14, wherein the plurality of heat pipes are arranged in at least one of the following ways:
- the heat conducting plate comprising a plurality of first grooves, and a portion of each of the plurality of heat pipes is embedded in a corresponding one of the plurality of first grooves; or,
- the second heat dissipation fin comprising a plurality of second grooves, and a portion of each of the plurality of heat pipes is embedded in a corresponding one of the plurality of second grooves.

16. The laser projection apparatus according to claim 14, wherein:
- the second laser assembly comprises a blue laser assembly and a green laser assembly; and
- the second heat dissipation fin comprises:
  - a first fin portion in contact with a region of the heat conducting plate corresponding to the blue laser assembly, and
  - a second fin portion in contact with a region of the heat conducting plate corresponding to the green laser assembly.

17. The laser projection apparatus according to claim 1, wherein:
- the first laser assembly comprises a red laser assembly, and the second laser assembly comprises a green laser assembly and a blue laser assembly;
- an operating temperature of the red laser assembly is less than or equal to 50° C.;
- an operating temperature of the blue laser assembly is less than or equal to 70° C.;
- an operating temperature of the green laser assembly is less than or equal to 65° C.;
- an operating temperature of a laser valve in the optical engine is less than or equal to 65° C.;
- an operating temperature of the lens system is less than or equal to 85° C.; and
- an operating temperature of the plurality of circuit boards is within a range of 80° C. to 120° C., inclusive.

18. A laser projection apparatus, comprising:
- a laser source system, an optical engine, a lens system that are sequentially connected along a laser beam propagation direction;
- a plurality of circuit boards; and
- a heat dissipation system comprising:
  - a liquid-cooling heat dissipation device comprising a first cooling head, a cooling drain, and a plurality of pipes with cooling medium inside, wherein the first cooling head and the cooling drain are connected through at least one of the plurality of pipes, and the first cooling head is disposed on a first side wall of a housing of the laser source system,
  - an air-cooling heat dissipation device comprising at least one first heat dissipation fin, a plurality of heat pipes, and a heat conducting plate, wherein the plurality of heat pipes are fixed on a second side wall of the housing of the laser source system through the heat conducting plate and extend into the at least one first heat dissipation fin, and
  - a fan assembly configured to drive airflow to sequentially flow through the cooling drain, the at least one first heat dissipation fin and the plurality of circuit boards to form a heat dissipation path.

19. The laser projection apparatus according to claim 18, wherein:
- the liquid-cooling heat dissipation device further comprises a second cooling head;
- the second cooling head is connected to the first cooling head and the cooling drain through at least one of the plurality of pipes; and
- the second cooling head is disposed on a back surface of a laser valve in the optical engine.

20. The laser projection apparatus according to claim 18, further comprising:
- an apparatus housing comprising an air inlet and an air outlet; and
- wherein the fan assembly comprises at least one of the following:
  - a first fan disposed at the air inlet and configured to drive airflow to sequentially blow through the cooling drain, the at least one first heat dissipation fin, the lens system, and the plurality of circuit boards,
  - a second fan disposed at a side of the at least one first heat dissipation fin proximate to the cooling drain, and configured to blow airflow to flow through the cooling drain toward the at least one first heat dissipation fin, the lens system, and the plurality of circuit boards,
  - a third fan disposed at a side of the at least one first heat dissipation fin proximate to the plurality of circuit boards, and configured to blow airflow to flow through the at least one first heat dissipation fin toward the lens system and the plurality of circuit boards, or
  - a fourth fan disposed at the air outlet, and configured to discharge airflow from flowing through the cooling drain, the at least one first heat dissipation fin, the optical engine, the lens system, and the plurality of circuit boards out of the apparatus housing.

* * * * *